United States Patent
Ho et al.

(10) Patent No.: US 12,057,351 B2
(45) Date of Patent: Aug. 6, 2024

(54) SEMICONDUCTOR DEVICE AND METHODS OF MANUFACTURING THE SAME

(71) Applicant: Taiwan Semiconductor Manufacturing Company, Ltd., Hsinchu (TW)

(72) Inventors: Yi Chen Ho, Taichung (TW); Yu-Chuan Chen, Taichung (TW); Chieh Cheng, Hsinchu (TW); Chi-Hsun Lin, Hsinchu (TW); Zheng-Yang Pan, Zhubei (TW); Shahaji B. More, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 267 days.

(21) Appl. No.: 17/654,347

(22) Filed: Mar. 10, 2022

(65) Prior Publication Data
US 2023/0154803 A1    May 18, 2023

Related U.S. Application Data

(60) Provisional application No. 63/264,131, filed on Nov. 16, 2021.

(51) Int. Cl.
*H01L 21/8238* (2006.01)
(52) U.S. Cl.
CPC ............ *H01L 21/823878* (2013.01); *H01L 21/823821* (2013.01)

(58) Field of Classification Search
CPC .... H01L 21/823878; H01L 21/823821; H01L 21/823431; H01L 27/0886; H01L 27/0924; H01L 21/823481; H01L 29/6681
See application file for complete search history.

(56) References Cited

U.S. PATENT DOCUMENTS

| 2018/0033699 A1* | 2/2018 | Zhu ............... H01L 21/823481 |
| 2018/0033700 A1* | 2/2018 | Jacob ............. H01L 29/66545 |
| 2018/0277536 A1* | 9/2018 | Wu ............... H01L 21/823437 |
| 2019/0326287 A1* | 10/2019 | Liaw ............. H01L 27/0207 |

* cited by examiner

*Primary Examiner* — Karen Kusumakar
*Assistant Examiner* — Adam S Bowen
(74) *Attorney, Agent, or Firm* — Harrity & Harrity, LLP

(57) ABSTRACT

Some implementations described herein provide a method that includes forming a set of fins of a device, where the set of fins comprises an isolation fin disposed between a first fin and a second fin of the set of fins. The method also includes forming an isolation structure on at least one side of the isolation fin, with the isolation fin providing electrical isolation between the first fin and the second fin of the set of fins. Additionally, or alternatively, some implementations described herein provide a method that includes forming a funnel-shaped isolation structure between a first set of fins and a second set of fins. Additionally, or alternatively, some implementations described herein provide a method that includes forming, after forming a first gate structure and a second gate structure, an isolation structure between the first gate structure and the second gate structure.

20 Claims, 41 Drawing Sheets

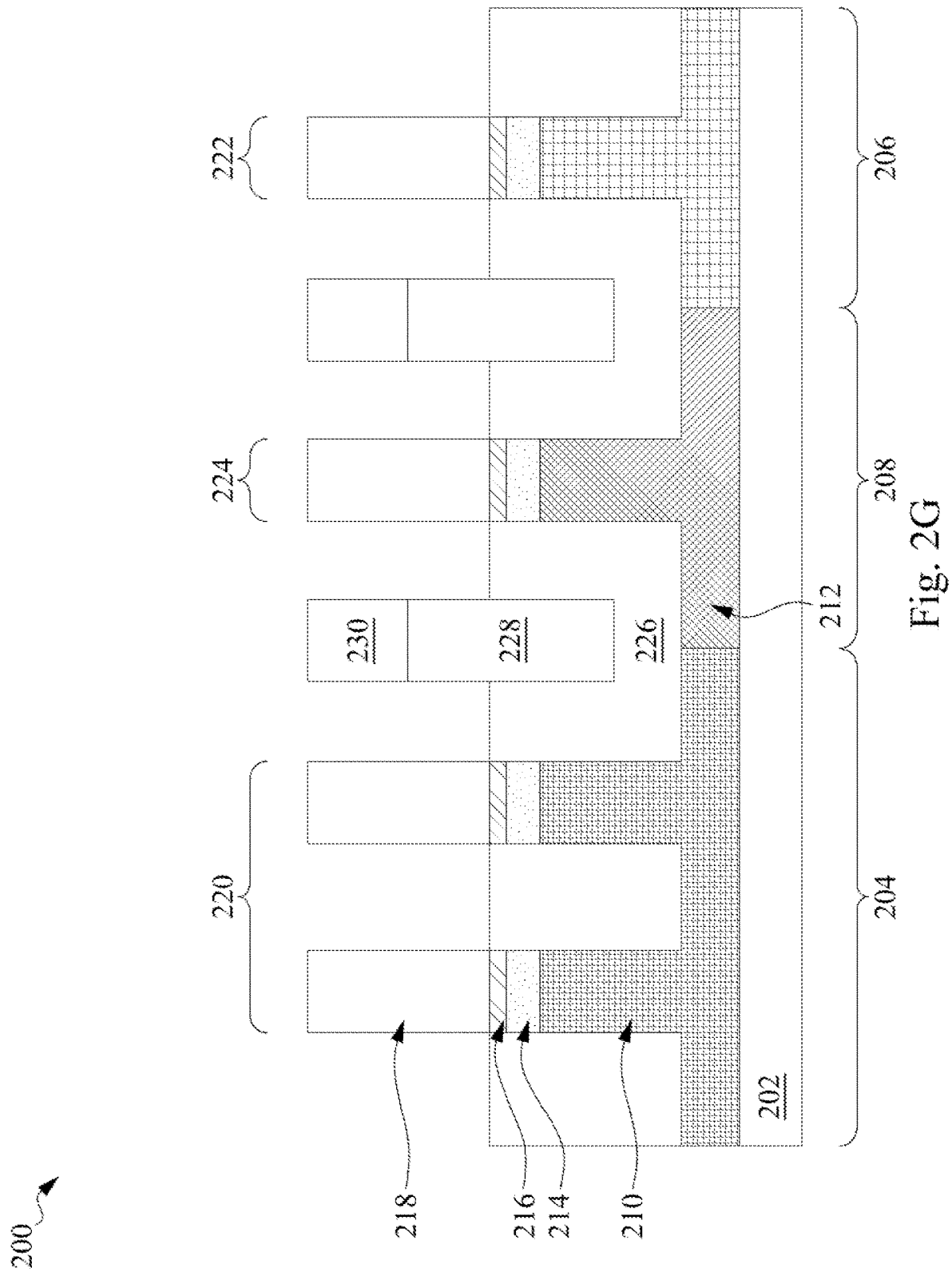

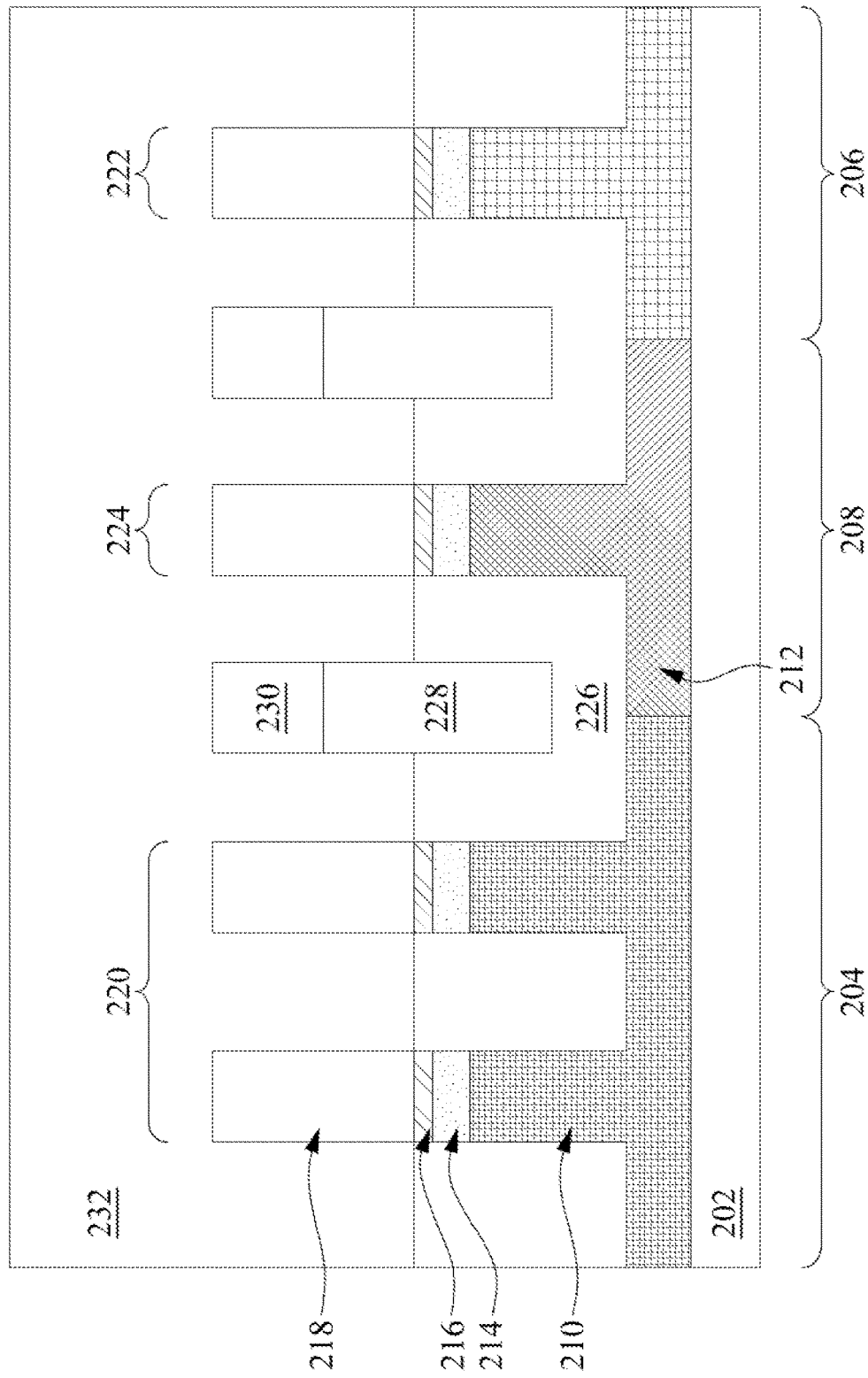

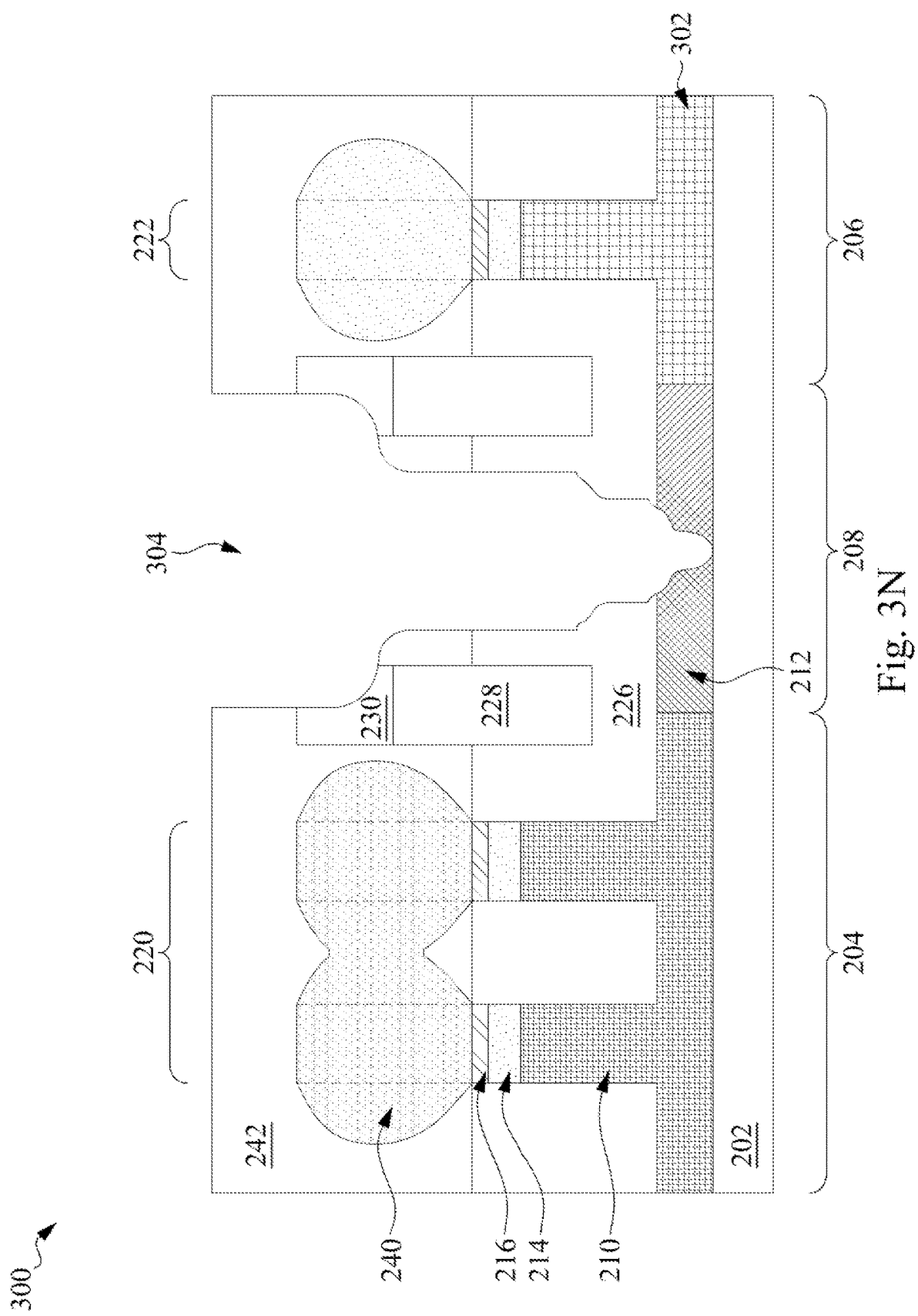

SEMICONDUCTOR DEVICE AND METHODS OF MANUFACTURING THE SAME

CROSS-REFERENCE TO RELATED APPLICATION

This Patent Application claims priority to U.S. Patent Application No. 63/264,131, filed on Nov. 16, 2021, and entitled "SEMICONDUCTOR DEVICE AND METHODS OF MANUFACTURING THE SAME." The disclosure of the prior Application is considered part of and is incorporated by reference into this Patent Application.

BACKGROUND

Fin-based field effect transistor (FinFET) devices are three-dimensional structures that have a conductive channel region that includes a fin of semiconductor material that rises above a substrate as a three-dimensional structure. A gate structure, configured to control a flow of charge carriers within the conductive channel region, wraps around the fin of semiconductor material. For example, in a gate-all-around (GAA) FinFET structure, the gate structure wraps around all sides of a fin of semiconductor material, thereby forming conductive channel regions on all sides of the fin. A commonly used type of field effect transistor (FET) is a metal-oxide-semiconductor field-effect transistor (MOSFET). A MOSFET can be used, for example, as a switch for an electrical signal (e.g., a radio frequency (RF) switch) or as an amplifier for an electrical signal (e.g., a low-noise amplifier (LNA)), among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
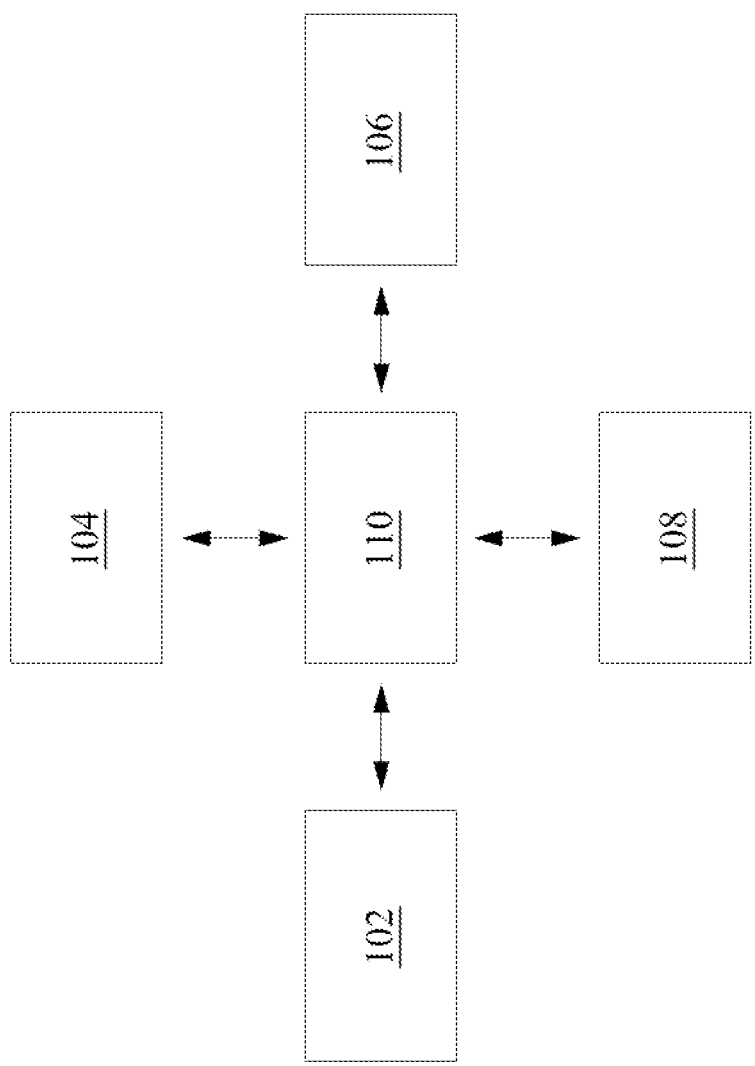
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a cut polysilicon structure may be formed within a device based on cutting out (e.g., etching away) a polysilicon structure to form a recessed portion of the device. The recessed portion may be filled with a dielectric material that may reduce a short channel effect and/or charge carrier tunneling between source/drains and/or between other semiconductor devices within the device.

Some implementations described herein provide techniques and apparatuses for forming an isolation structure between source/drains and/or between other semiconductor devices within a device. The isolation structure may be a funnel-shaped isolation structure having a greatest width at an upper portion of the funnel-shaped isolation structure and a smallest width at a lower portion of the funnel-shaped isolation structure. In this way, the funnel-shaped isolation structure may provide a greatest electrical barrier at the upper portion of the funnel-shaped isolation structure, which may be disposed between portions of neighboring fins having n-doped or p-doped epitaxial material. In some cases, the isolation structure may be formed on an isolation fin disposed between a first fin and a second fin. In this way, the isolation structure may have improved structural support based on bonding with the fin. In some cases, the isolation structure may be formed between a first gate structure and a second gate structure, with the isolation structure extending to at least a height of the first gate structure and the second gate structure from a well below the first gate structure and the second gate structure. In this way, the isolation structure may provide isolation between gate structures without forming the isolation structure in place of a polysilicon structure that may be used for another gate and/or to improve a device density of the device. In some implementations, the isolation structure may be a multi-layered isolation structure having layers with different N concentrations. The isolation structure may be deposited in a multi-stage deposition to separately deposit material for the multi-layered isolation structure. For example, one or more semiconductor processing tools may deposit an outside portion of the isolation structure using a first material and then may deposit (e.g., after etching a portion of the outside portion or after depositing the outside portion with a film-based deposition such as atomic layer deposition) an inside portion of the isolation structure using a second material. In some implementations, the multi-layered isolation structure may be a fully stressed and dense semiconductor structure. Additionally, or alternatively, the isolation structure may be formed at different levels of mechanical strength based on an atomic layer deposition process used to deposit layers of the isolation structure.

FIG. 1 is a diagram of an example environment 100 in which systems and/or methods described herein may be implemented. As shown in FIG. 1, environment 100 may include a plurality of semiconductor processing tools 102-108 and a wafer/die transport tool 110. The plurality of semiconductor processing tools 102-108 may include a deposition tool 102, an etching tool 104, a planarization tool 106, an ion implantation tool 108, and/or another semiconductor processing tool. The tools included in the example environment 100 may be included in a semiconductor clean room, a semiconductor foundry, a semiconductor processing and/or manufacturing facility, or another location.

The deposition tool 102 is a semiconductor processing tool that is capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The etching tool 104 is a semiconductor processing tool that is capable of etching various types of materials of a substrate, wafer, or semiconductor device. For example, the etching tool 104 may include a wet etching tool, a dry etching tool, and/or another type of etching tool. A wet etching tool may include a chemical etching tool or another type of wet etching tool that includes a chamber filled with an etchant. The substrate may be placed in the chamber for a particular time period to remove particular amounts of one or more portions of the substrate. A dry etching tool may include a plasma etching tool, a laser etching tool, a reactive ion etching tool, or a vapor phase etching tool, among other examples. A dry etching tool may remove one or more portions of the substrate using a sputtering technique, a plasma-assisted etch technique (e.g., a plasma sputtering technique or another type of technique involving the use of an ionized gas to isotropically or directionally etch the one or more portions), or another type of dry etching technique.

The planarization tool 106 is a semiconductor processing tool that is capable of polishing or planarizing various layers of a wafer or semiconductor device. For example, the planarization tool 106 may include a chemical mechanical planarization (CMP) tool and/or another type of planarization tool that polishes or planarizes a layer or surface of deposited or plated material. The planarization tool 106 may polish or planarize a surface of a semiconductor device with a combination of chemical and mechanical forces (e.g., chemical etching and free abrasive polishing). The planarization tool 106 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The ion implantation tool 108 is a semiconductor processing tool that is capable of implanting ions into a substrate such as a semiconductor wafer. The ion implantation tool 108 generates ions in an arc chamber from a source material such as a gas or a solid. The source material is provided into the arc chamber, and an arc voltage is discharged between a cathode and an electrode to produce a plasma containing ions of the source material. One or more extraction electrodes are used to extract the ions from the plasma in the arc chamber and accelerate the ions to form an ion beam. The ion beam may be directed toward the substrate such that the ions are implanted below the surface of the substrate to dope the substrate.

Wafer/die transport tool 110 includes a mobile robot, a robot arm, a tram or rail car, an overhead hoist transfer (OHT) vehicle, an automated material handling system (AMES), and/or another type of tool that is used to transport wafers and/or dies between semiconductor processing tools 102-108 and/or to and from other locations such as a wafer rack, a storage room, or another location. In some implementations, wafer/die transport tool 110 may be a programmed tool to travel a particular path and/or may operate semi-autonomously or autonomously.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2A:
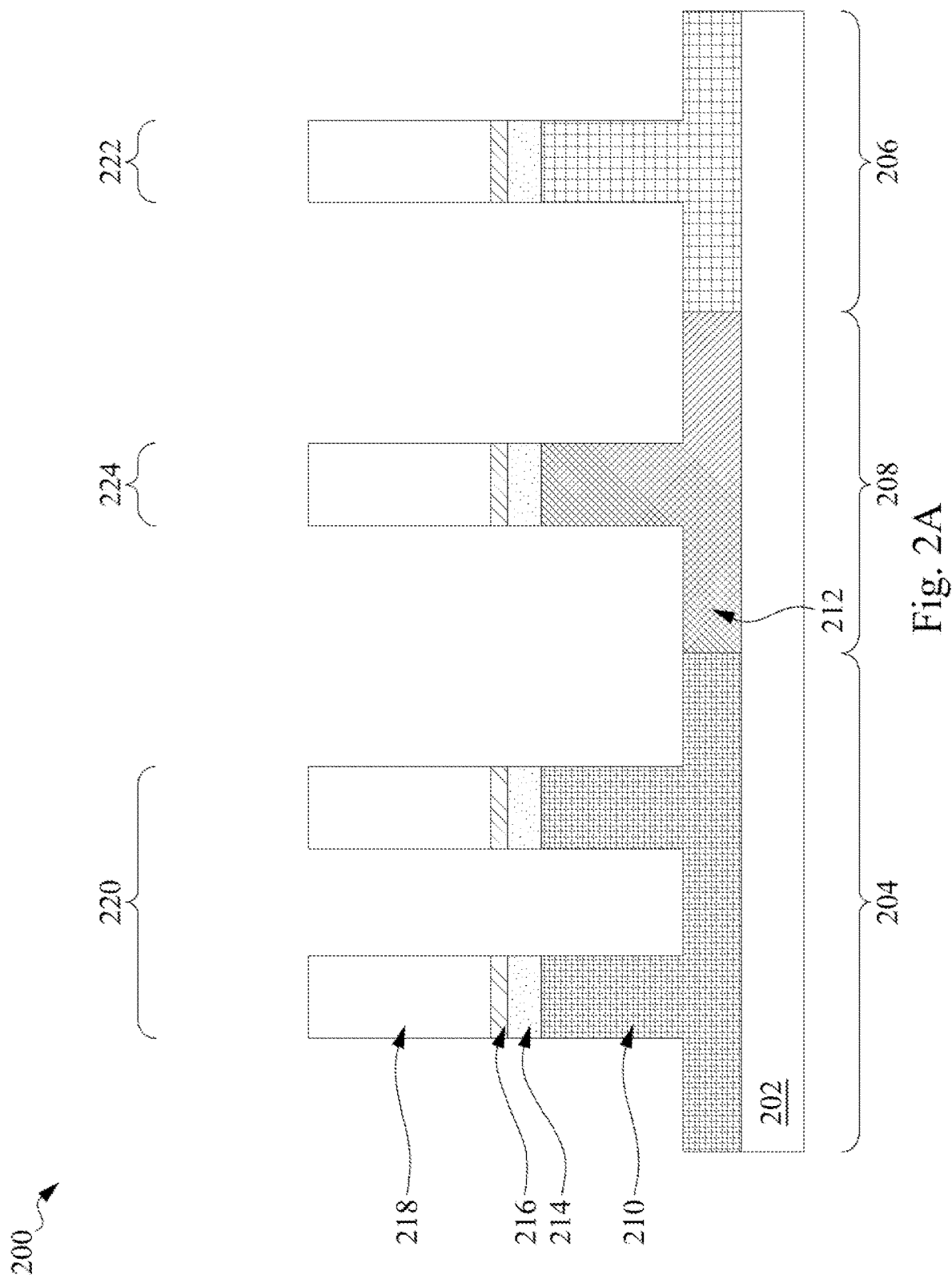
FIG. 2A-2Q are diagrams of an example semiconductor device described herein.
Figure 2B:
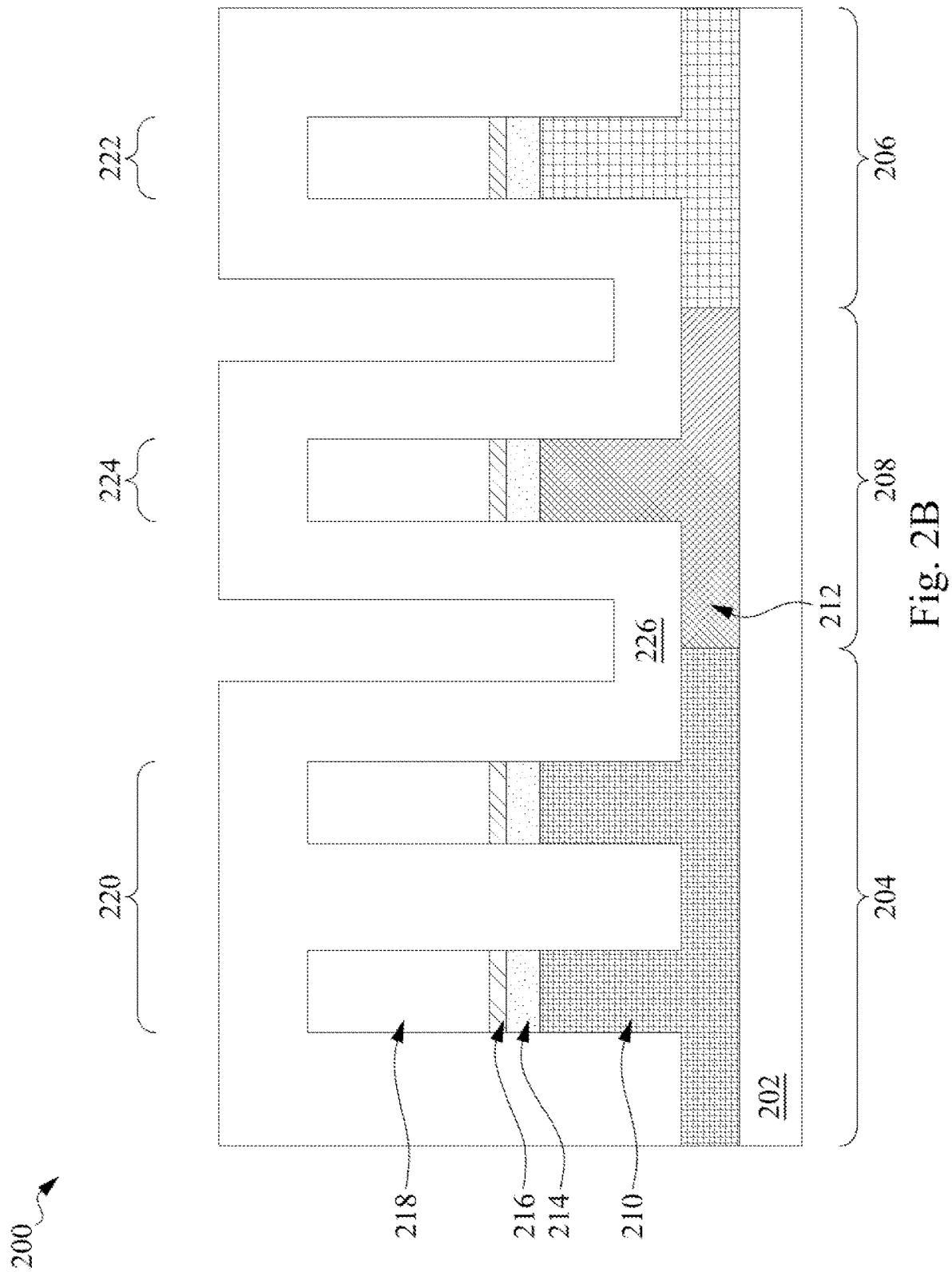
Figure 2C:
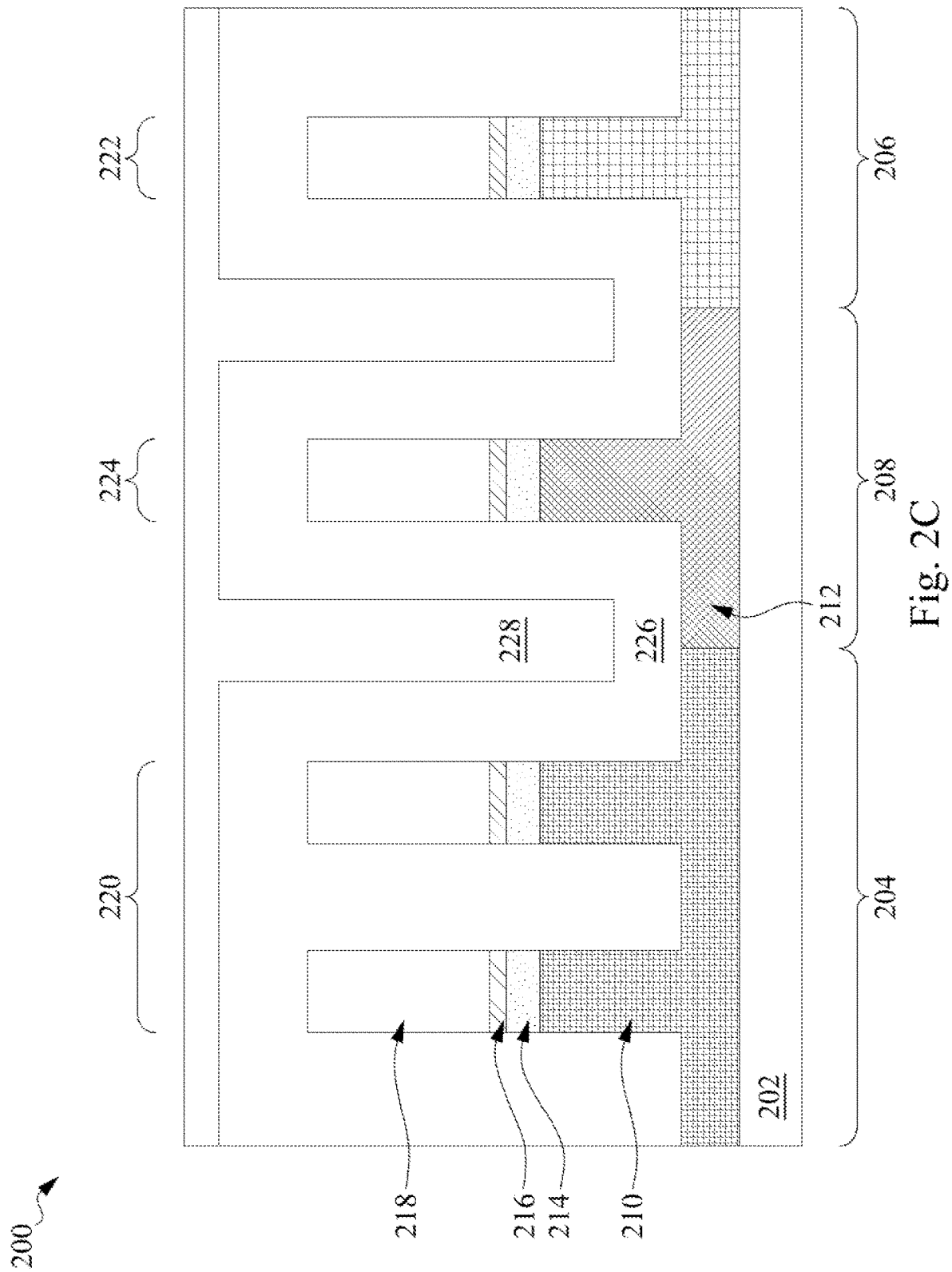
Figure 2D:
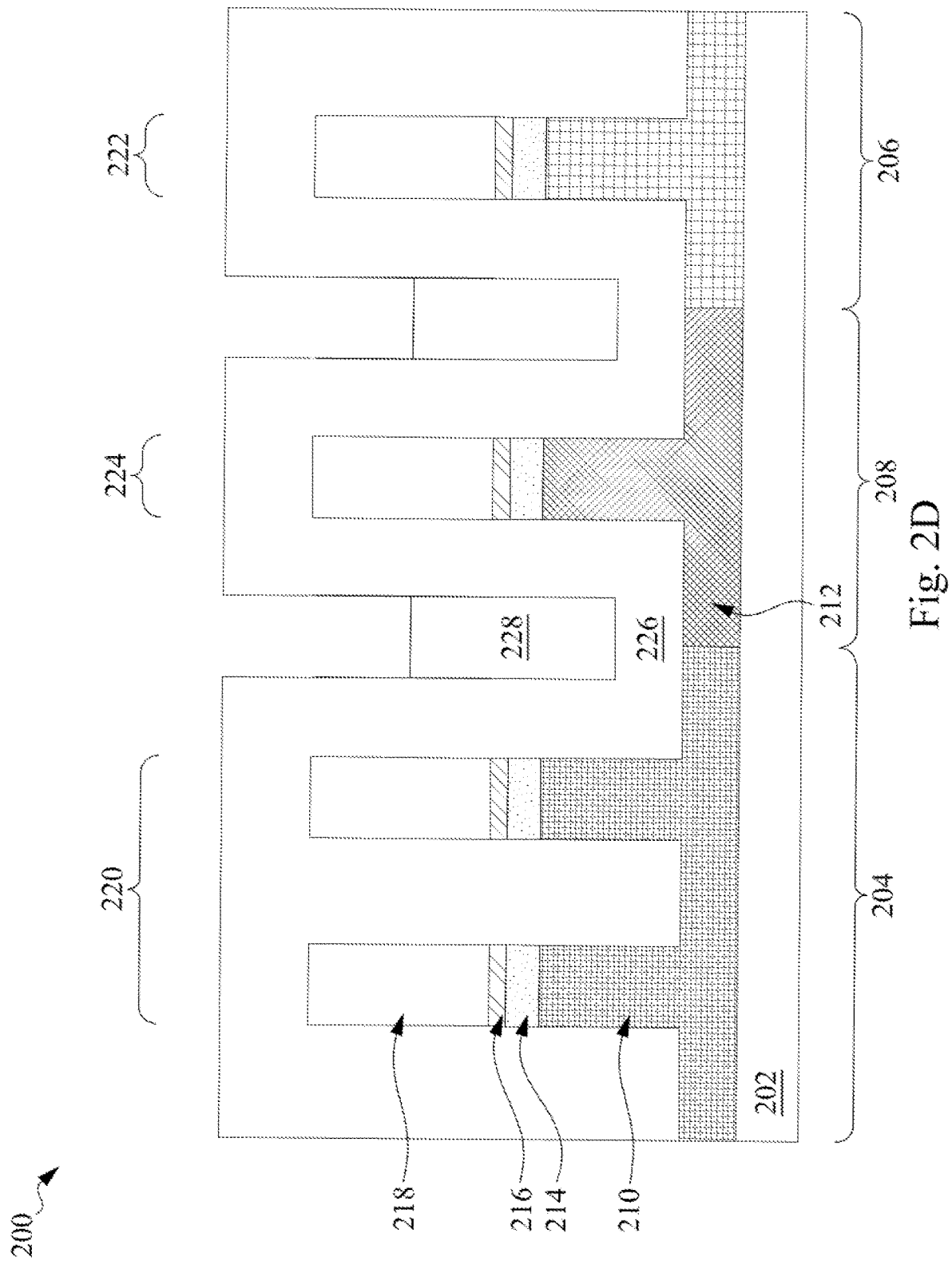
Figure 2E:
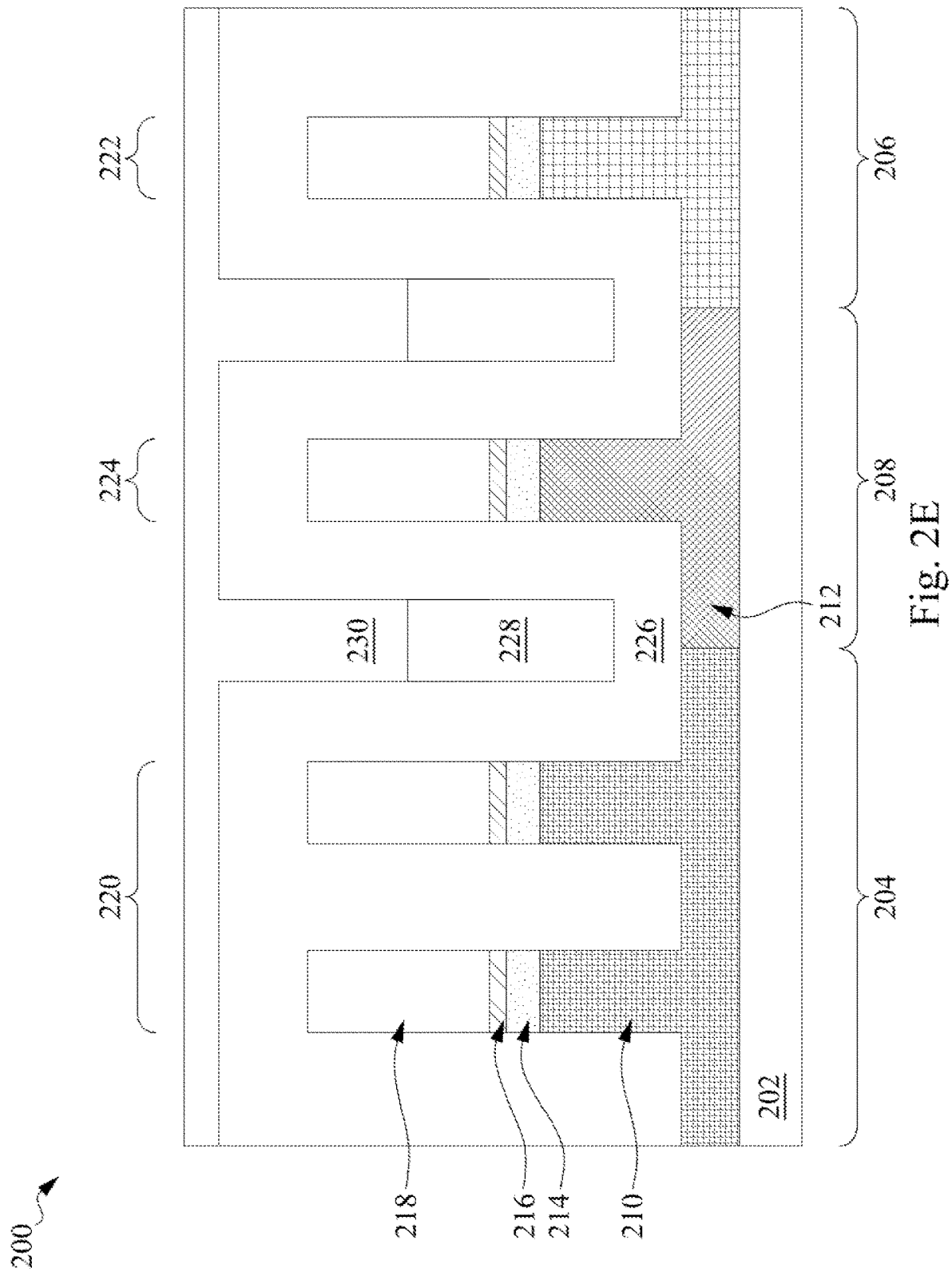
Figure 2F:
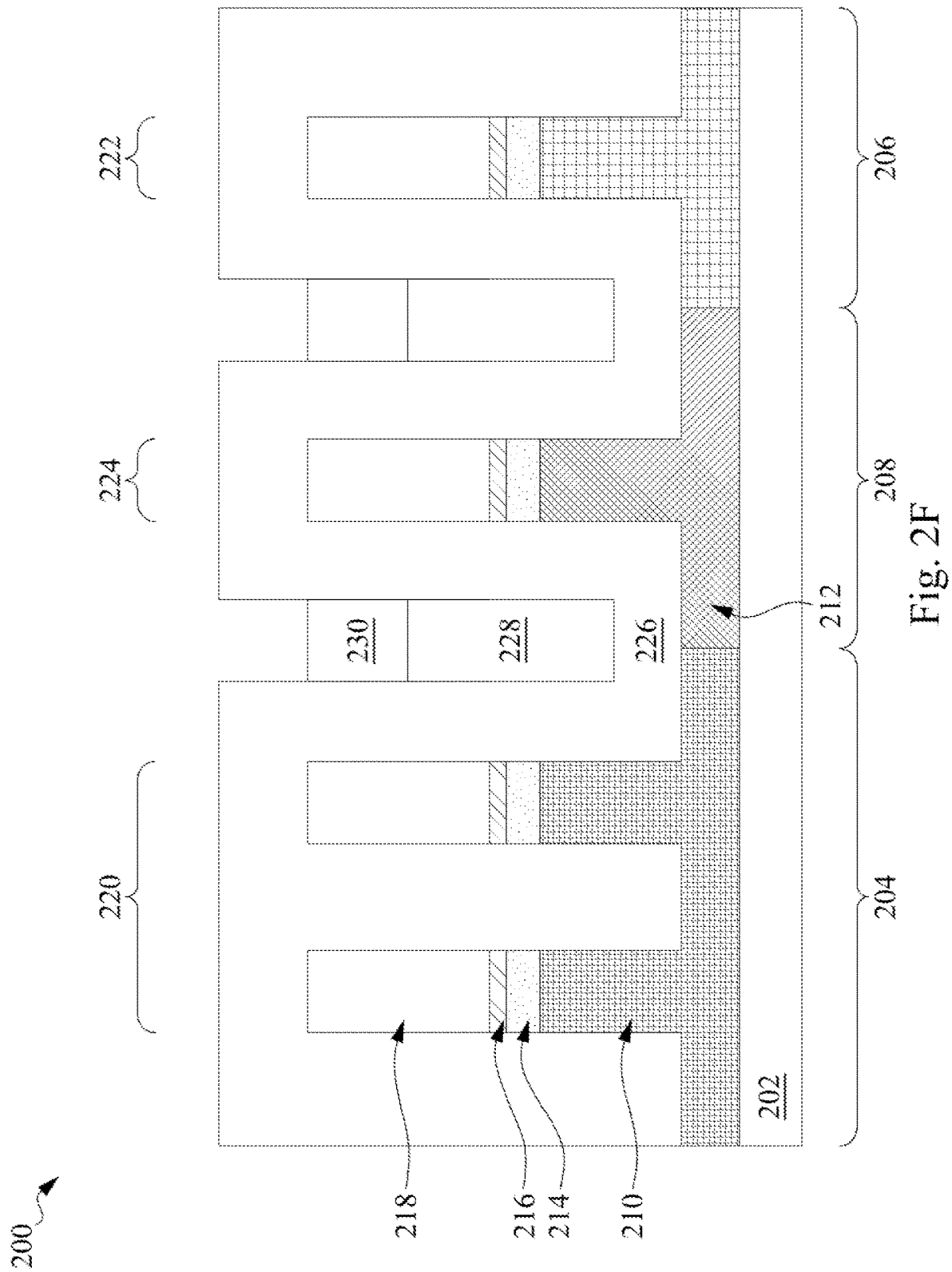
Figure 2I:
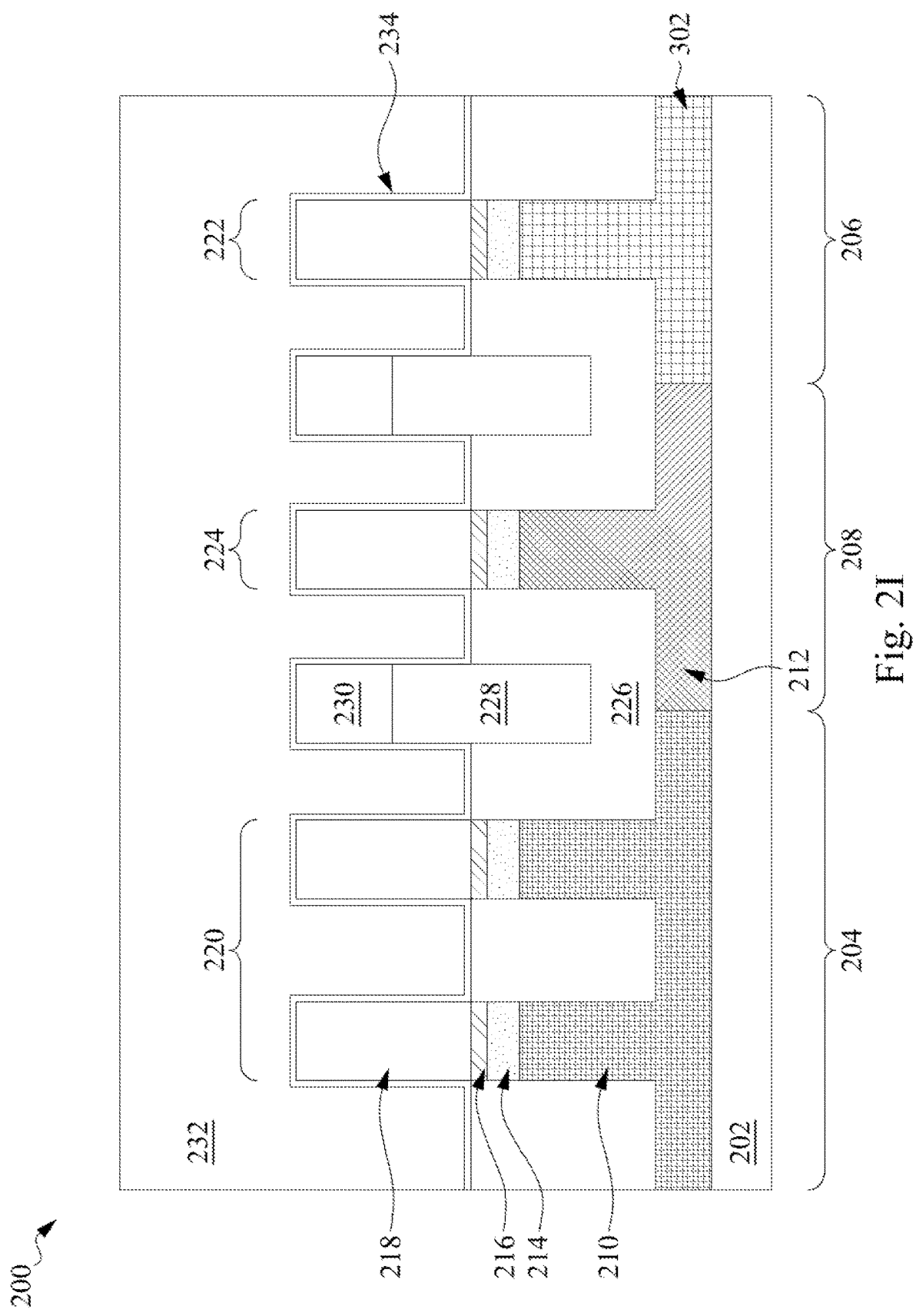
Figure 2J:
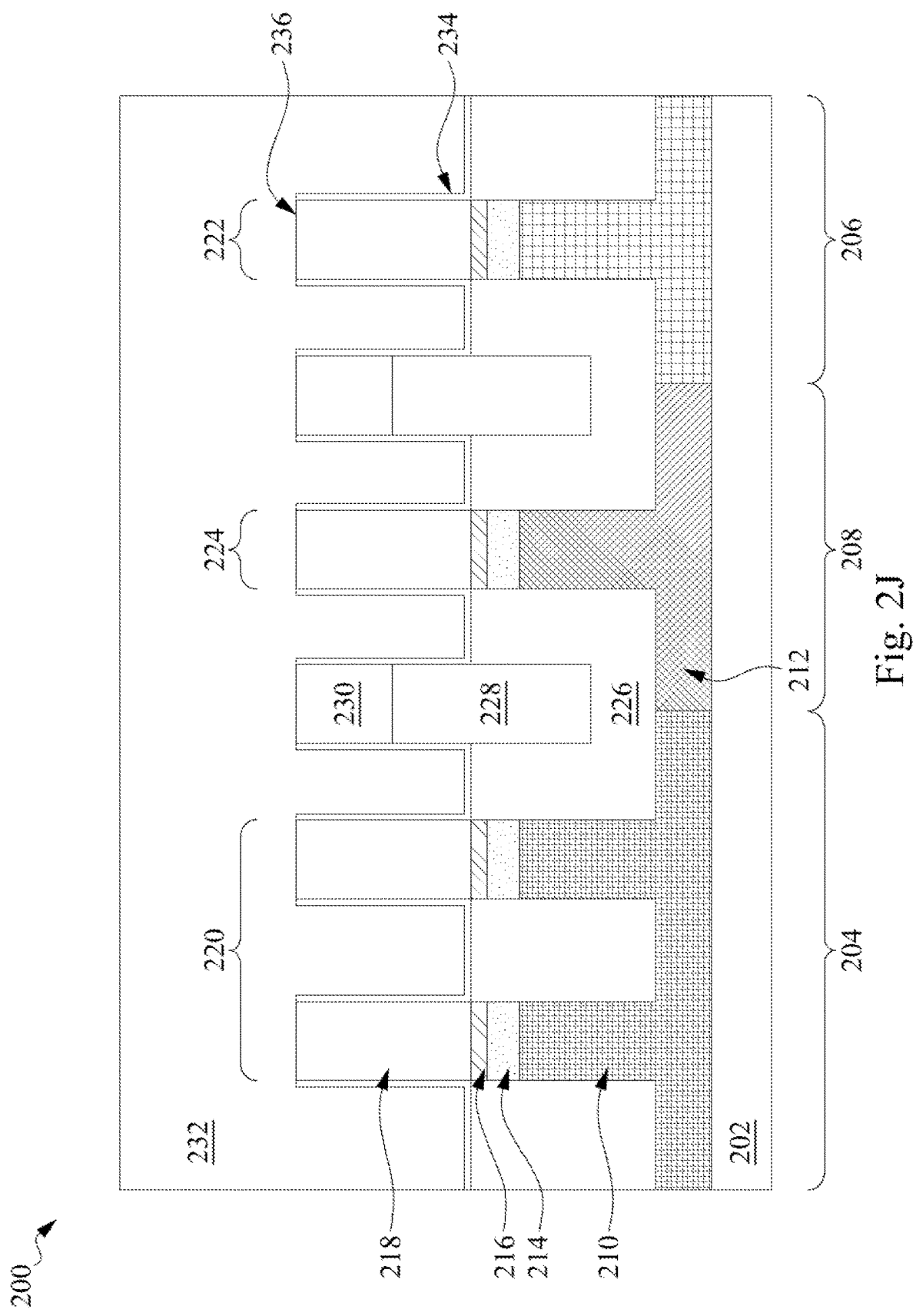
Figure 2K:
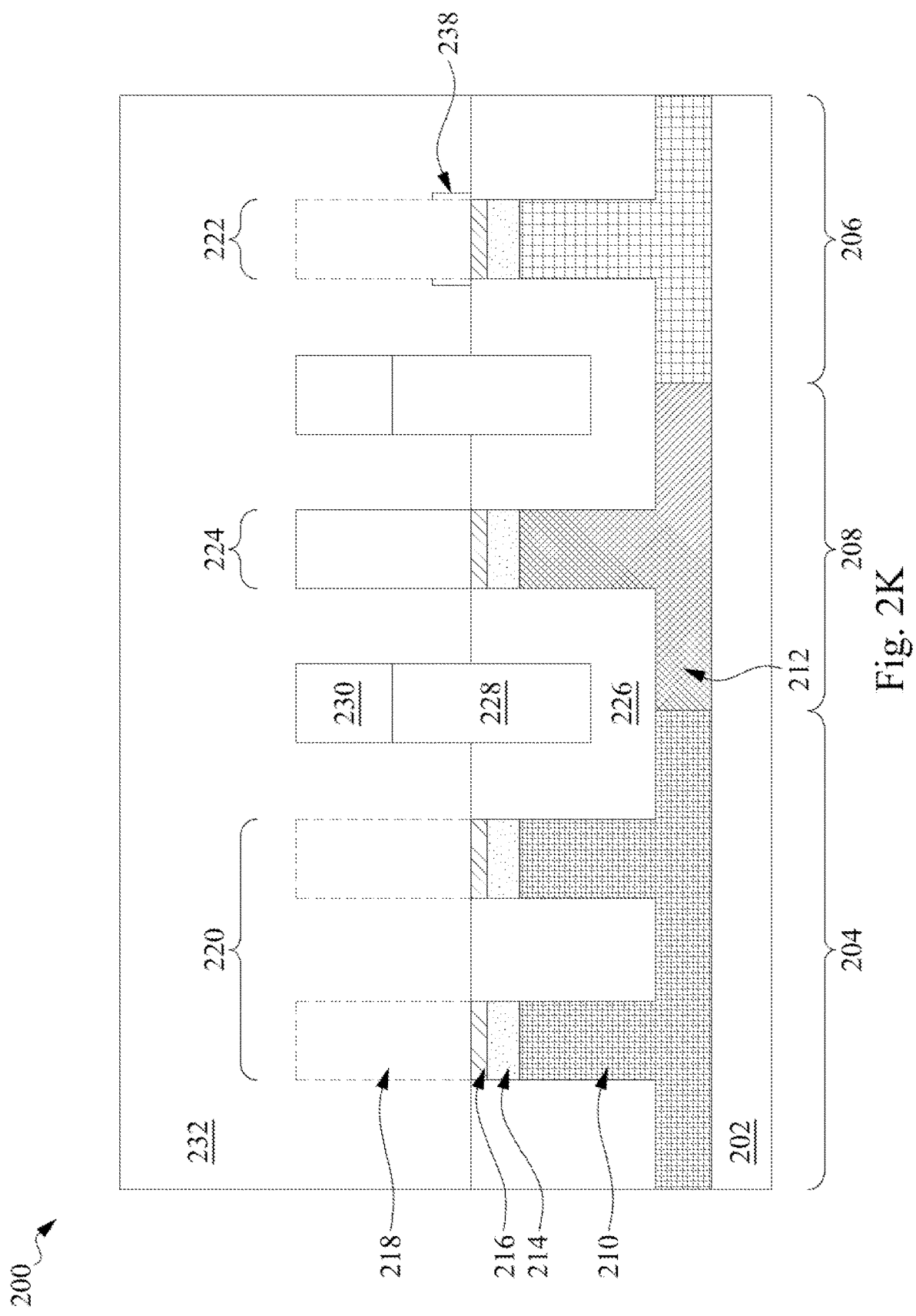
Figure 2L:
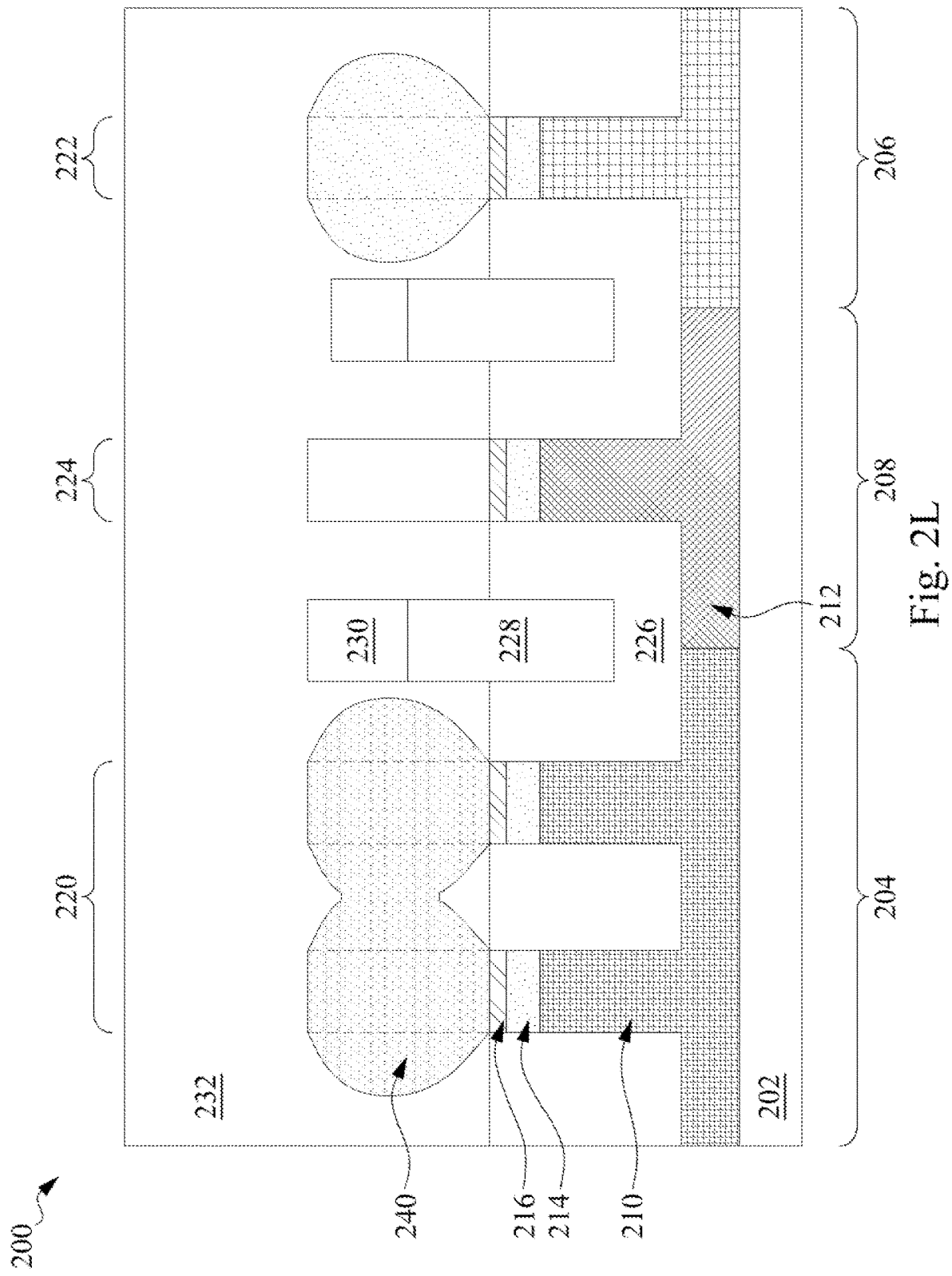
Figure 2M:
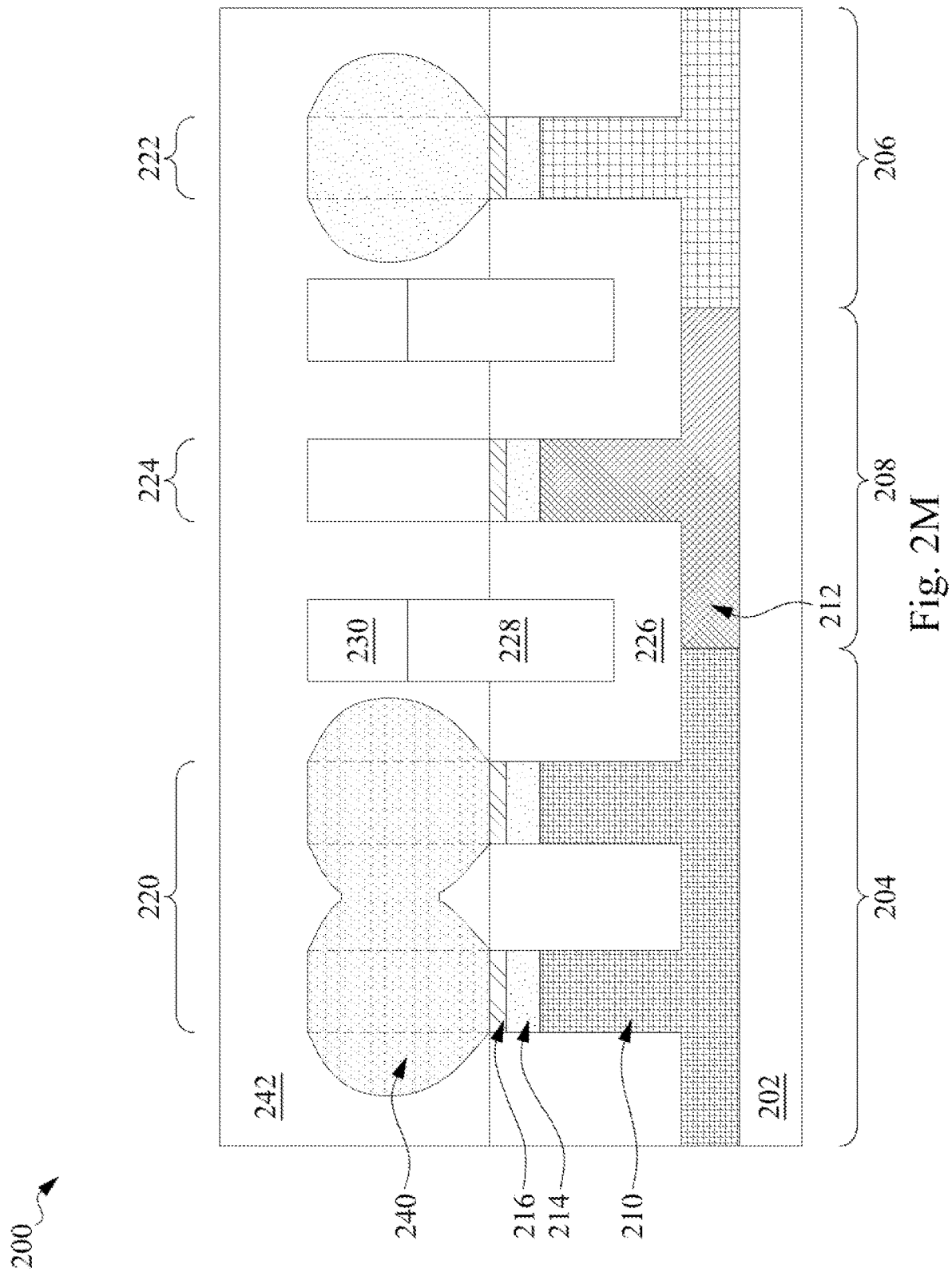
Figure 2N:
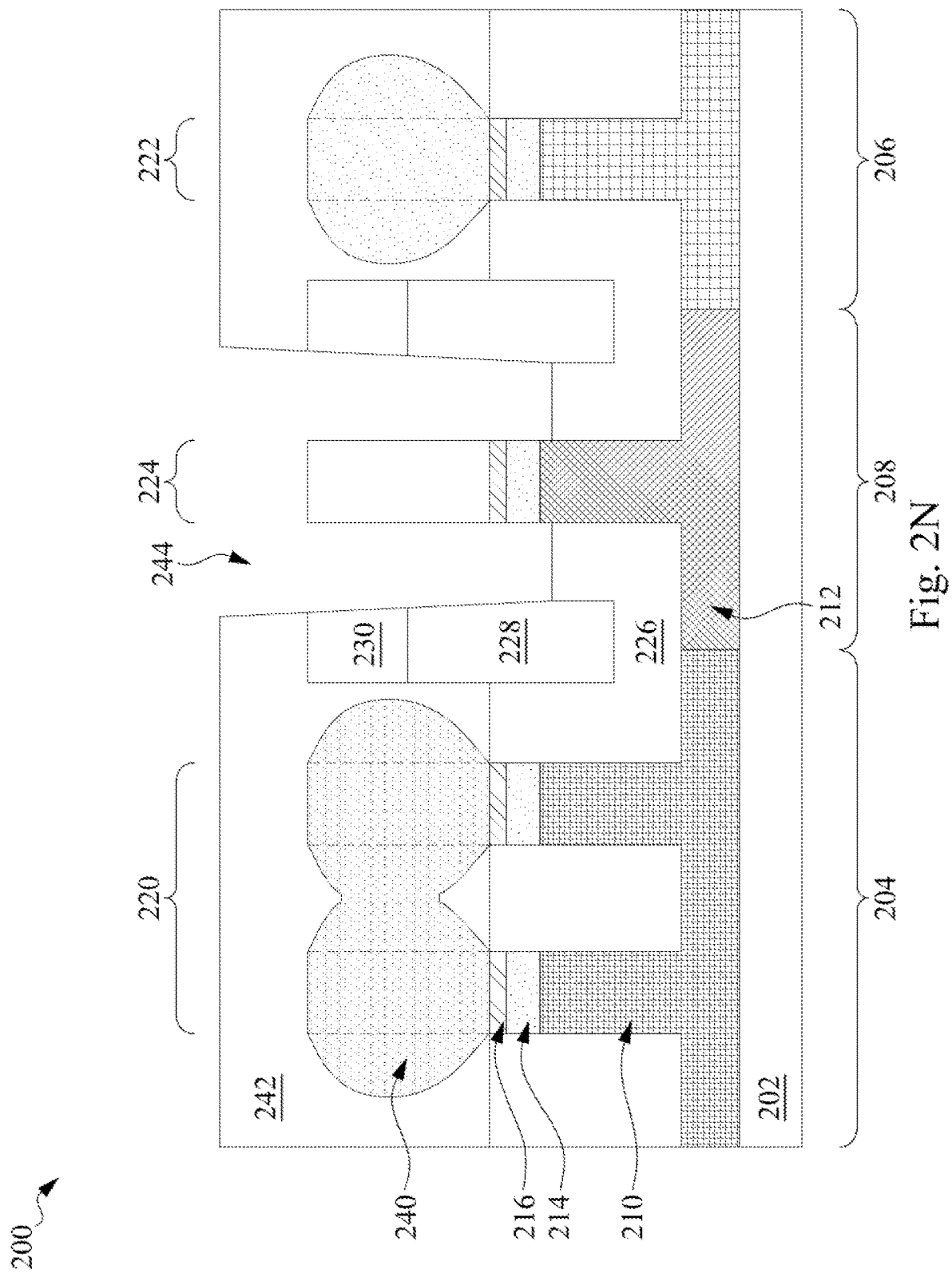
Figure 2O:
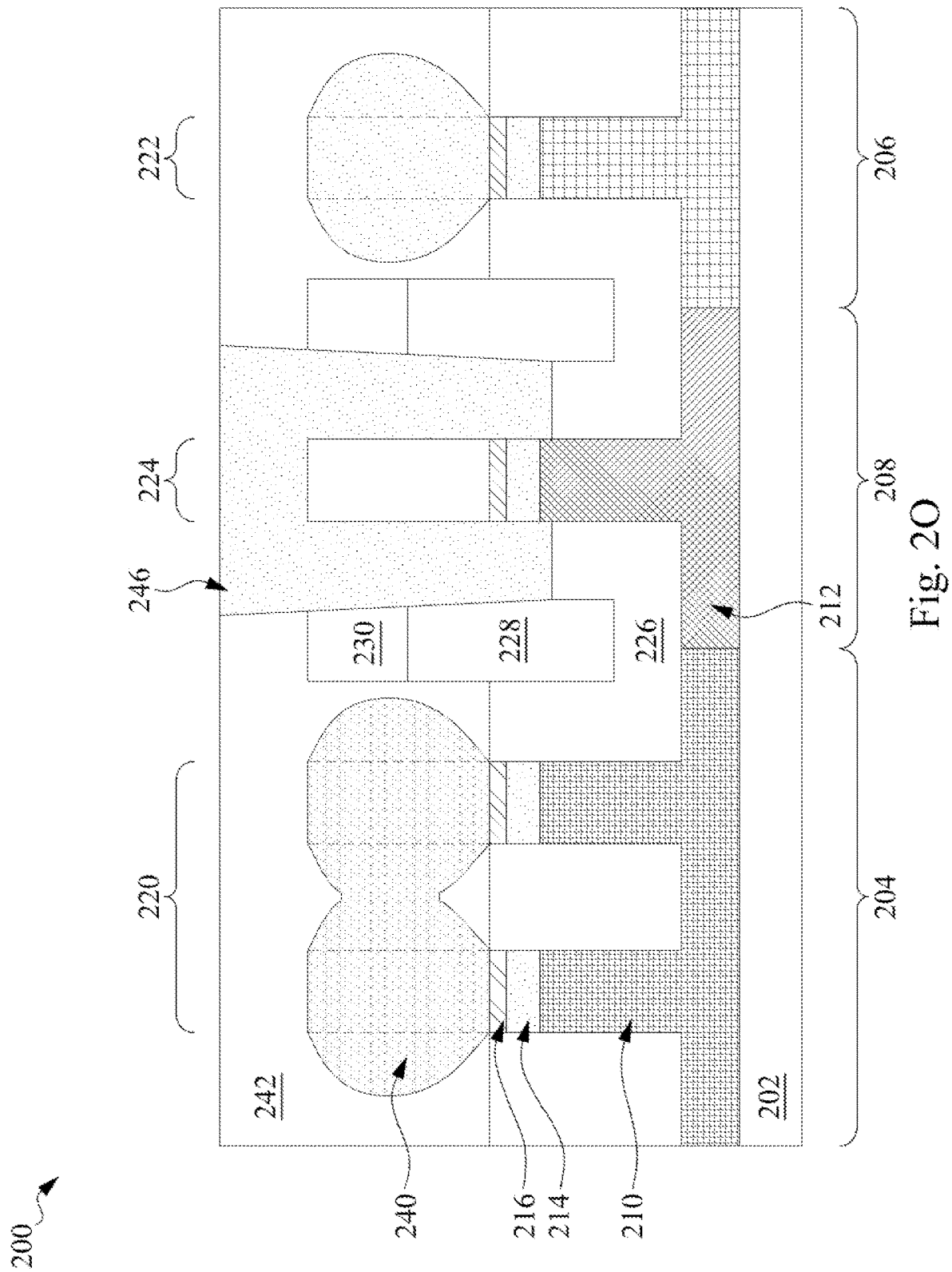
Figure 2P:
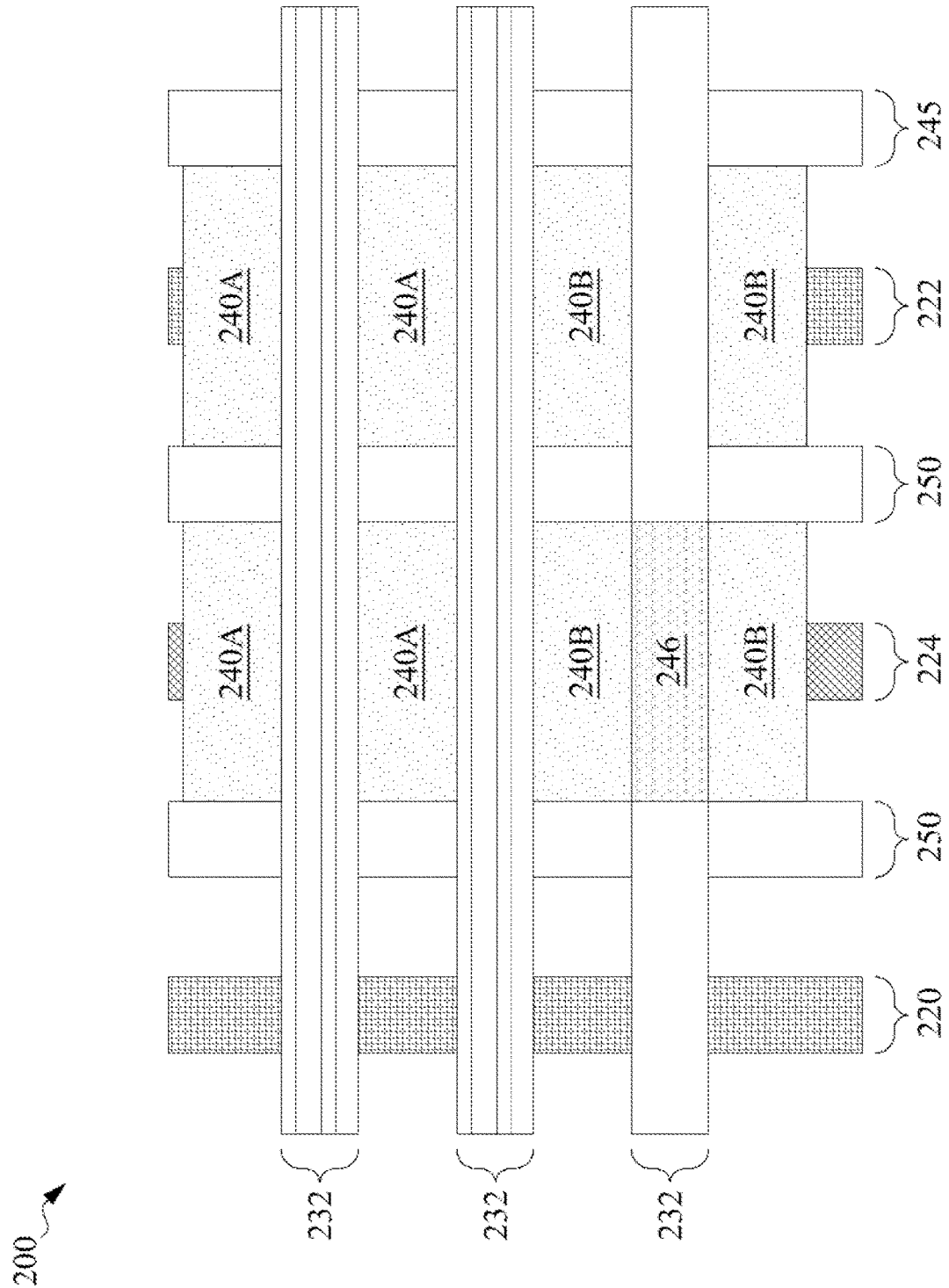
Figure 2Q:
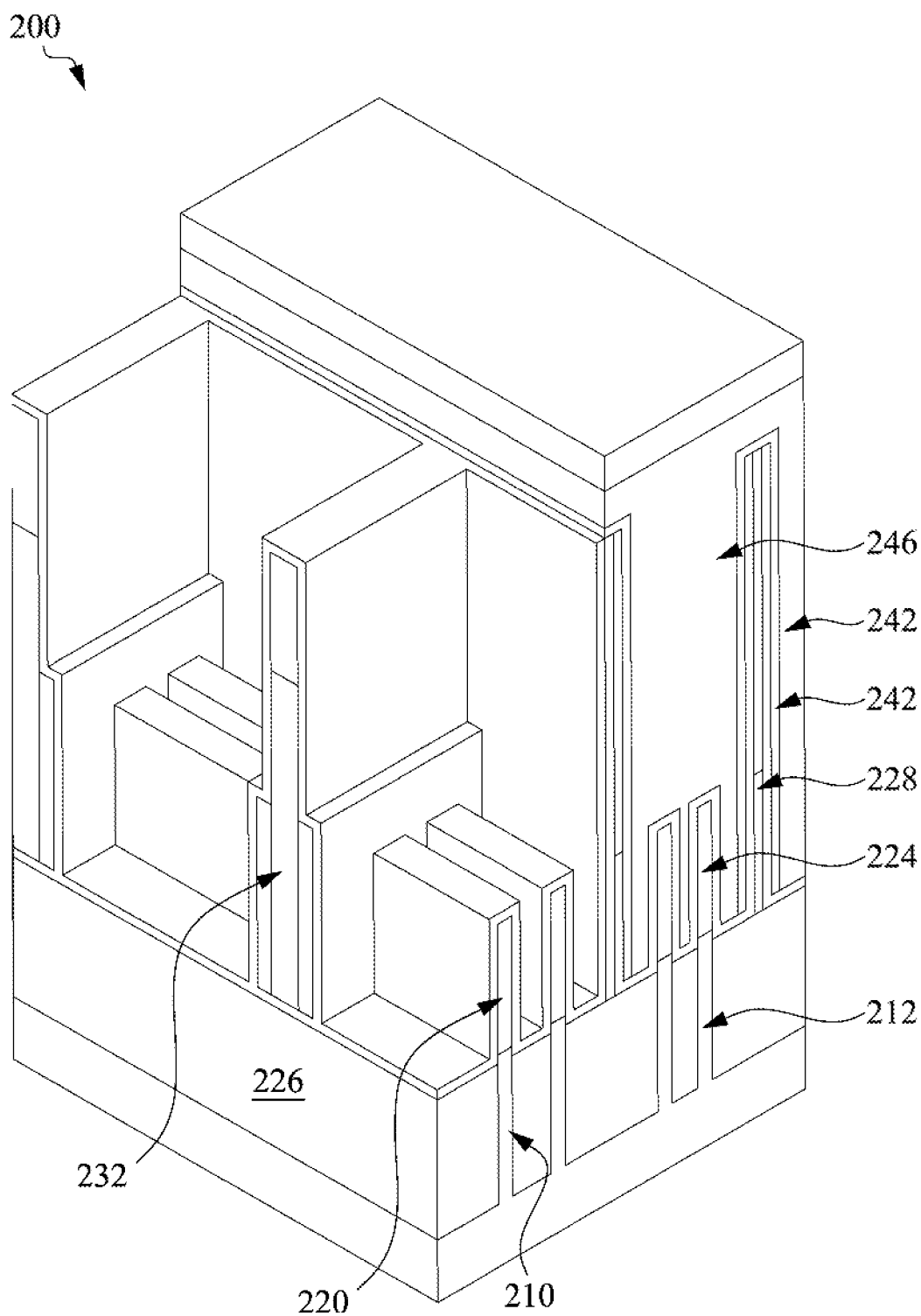

FIGS. 2A-2Q are diagrams of an example semiconductor device 200 described herein. Semiconductor device 200 may be manufactured using an example process as shown in FIGS. 2A-2Q. The example process may include one or more operations not shown (e.g., lithography operations, operations performed on different portions of an electronic device that includes the semiconductor device 200) and/or operations shown in the example process may be performed in a different order from the order shown in FIGS. 2A-2Q. The semiconductor device 200 may include one or more additional devices, structures, and/or layers not shown in FIGS. 2A-2Q. For example, the semiconductor device 200 may include additional layers and/or dies formed on layers above and/or below the portion of the semiconductor device 200 shown in FIGS. 2A-2Q. Additionally, or alternatively, one or more additional semiconductor structures and/or semiconductor devices may be formed in a same layer, with a lateral displacement, of a device that includes the semiconductor device 200 shown in FIGS. 2A-2Q.

As shown in FIG. 2A, the semiconductor device 200 includes a substrate 202. The substrate 202 may include a semiconductor die substrate, a semiconductor wafer, or another type of substrate in and/or on which semiconductor devices may be formed. In some implementations, the substrate 202 is formed of silicon (Si), a material including silicon, a III-V compound semiconductor material such as gallium arsenide (GaAs), a silicon on insulator (SOI), or another type of semiconductor material.

The semiconductor device 200 includes a metal-oxide-semiconductor (MOS) portion 204 having first polarity (e.g., an n-MOS), a MOS portion 206 having the first polarity (e.g., an n-MOS), and a MOS portion 208 having a second polarity (e.g., a p-MOS) that is opposite from the first polarity. The MOS portion 204 and the MOS portion 206 may include a well 210 having the second polarity (e.g., a p-well) and the MOS portion 208 may include a well 212 having the first polarity (e.g., an n-well). In some implementations, the well 210 has a p-type dopant, such as boron, aluminum, gallium, or indium, among other p-type dopants. In some implementations, the well 212 has an n-type dopant, such as phosphorus, arsenic, antimony, bismuth, or lithium, among other n-type dopants. In other implementations, the well 210 has an n-type dopant and the well 212 has a p-type dopant.

The well 210 and the well 212 may form lower portions of fins extending from the substrate 202. The fins may include a stack of materials disposed on the well 210 and the well 212. The fins may include an anti-punch through (APT) layer 214 disposed on the well 210 and the well 212. The APT layer 214 may be configured to provide APT dopants that reduce n-type and/or p-type dopants from source/drain regions of the fins from penetrating into underlying layers of the semiconductor device 200, such as the well 210 or the well 212. Furthermore, inclusion of the APT layer 214 may remove a need to implement an APT implant at least in devices of a first type (e.g., n-type or p-type) during formation of such FinFET devices, which may result in undoped channel regions and improved electrical functionality. APT dopant implantation may be performed to form devices of a second type (e.g., the other of n-type or p-type) in the semiconductor device 200.

The semiconductor device 200 may include a barrier implant region 216 formed on the APT layer 214. The barrier implant region 216 may reduce electromigration between the APT layer 214 and an active fin region 218 disposed on the barrier implant region 216. The barrier implant region 216 may include a silicon-based material that is doped (e.g., with a p-dopant or an n-dopant) and has implanted carbon or another material. In some aspects, the active fin region 218 may include a silicon-based material, such as silicon germanium (e.g., having a concentration of germanium that is greater than or equal to 1%) or pure silicon (e.g., having a concentration of germanium that is less than 1%).

In some implementations, one or more semiconductor processing tools may form a set of fins 220 associated with (e.g., formed on) the well 210 in the MOS portion 204, a set of fins 222 associated with the well 210 in the MOS portion 206, and an isolation fin 224 associated with the well 212 in the MOS portion 208.

In some implementations, the one or more semiconductor processing tools (e.g., the ion implantation tool 108) form the wells 210 and 212 using ion implantation to implant dopants (e.g., of different polarity) into the wells 210 and 212 in separate processes. For example, the one or more semiconductor processing tools may provide a photoresist and/or a mask on a top surface of the MOS portion 208 while implanting a dopant into the MOS portions 204 and 206. The one or more semiconductor processing tools may also provide a photoresist and/or a mask on a top surface of the MOS portions 204 and 206 while implanting a dopant into the MOS portion 208.

In some implementations, the one or more semiconductor processing tools (e.g., the deposition tool 102) form the APT layer 214 on a top surface of the wells 210 and 212 and may form the barrier implant region 216 on a top surface of the APT layer 214. For example, the one or more semiconductor processing tools deposit the APT layer 214 on a top surface of the wells 210 and 212 and deposit the barrier implant region 216 on a top surface of the APT layer 214 using chemical vapor deposition or physical vapor deposition, among other examples. In some implementations, the one or more semiconductor processing tools (e.g., the planarization tool 106) may polish and/or planarize the layers of the set of fins 220, the set of fins 222, and the isolation fin 224 after one or more layers are deposited. In this way, a top layer may be suitable for depositing additional material of the semiconductor device 200 and/or may improve uniformity of a subsequent etching process.

In some implementations, the one or more semiconductor processing tools (e.g., the deposition tool 102 and the etching tool 104) may form the active fin region 218 of the fins. In some implementations, the one or more semiconductor processing tools may deposit a first material for p-MOS or n-MOS channels (e.g., silicon germanium or pure silicon) and may then remove the first material from one or more MOS portions 204, 206, or 208 having an opposite polarity from the first material. The one or more semiconductor processing tools may deposit a second material for n-MOS or p-MOS channels (e.g., having an opposite polarity from the first material) on the one or more MOS portions 204, 206, or 208 from which the first material was removed. In this way, the channels of the set of fins 220 may have a same polarity as the channels of the set of fins 222, whereas the channels of the isolation fin 224 may have an opposite polarity.

After forming fin stacks that include the APT layer 214 stacked on the wells 210 and 212, the barrier implant region 216 stacked on the APT layer 214, and the active fin region 218 stacked on the barrier implant region 216, the one or more semiconductor processing tools (e.g., the etching tool 104) may remove portions of the fin stack to form the set of fins 220, the set of fins 222, and the isolation fin 224. For example, the one or more semiconductor processing tools may use dry etching to form the fins 220, 222, and 224 with generally vertical sidewalls with spacing between the fins.

As shown in FIG. 2B, material for a set of trench isolation structures 226 may be disposed on surfaces of the set of fins 220, the set of fins 222, and the isolation fin 224. For example, the material for the set of trench isolation structures 226 may fill one or more gaps between fins (e.g., between fins of the set of fins 220) and/or may leave one or more gaps (e.g., recessed portions) between fins (e.g., between the isolation fin 224 and a nearest fin of the set of fins 220 and/or between the isolation fin 224 and the set of fins 222). The one or more semiconductor processing tools (e.g., the deposition tool 102) may deposit the material for the set of trench isolation structures 226 using chemical vapor deposition or physical vapor deposition, among other examples. In some implementations, the material for a set of trench isolation structures 226 includes silicon oxide, silicon germanium, silicon carbon-nitride, silicon nitride, and/or a high-K material.

As shown in FIG. 2C, a first dummy fin portion 228 may be deposited in the gaps between fins. For example, the one or more semiconductor processing tools (e.g., deposition tool 102) may deposit material for the first dummy fin portion 228 using PVD or CVD. In some implementations, the material for the first dummy fin portion 228 may include Silicon carbon nitride, a high-K material, poly 2-ethyl-2-oxazoline (PEOx), and/or another passivation layer material to reduce reactivity between materials on opposite sides of the first dummy fin portion 228.

As shown in FIG. 2D, a portion of the material of the first dummy fin portion 228 may be removed. For example, the one or more semiconductor processing tools (e.g., etching tool 104 and/or planarization tool 106) may remove the material of the first dummy fin portion 228 from surfaces of the material for the trench isolation structure 226 that are disposed above the active fin region 218. In some aspects, the material of the first dummy fin portion 228 may be removed from regions of the semiconductor device 200 except within gaps between fins. In some aspects, upper portions of the material of the first dummy fin portion 228 may be removed from the gaps between fins, as shown in FIG. 2D.

As shown in FIG. 2E, a second dummy fin portion 230 may be deposited on top of the first dummy fin portion 228 (e.g., within gaps between fins). For example, the one or more semiconductor processing tools (e.g., deposition tool 102) may deposit material for the second dummy fin portion 230 using PVD or CVD. In some implementations, the material for the second dummy fin portion 230 may include silicon carbon nitride, a high-K material, poly 2-ethyl-2-oxazoline (PEOx), and/or another passivation layer material to reduce reactivity between materials on opposite sides of the first dummy fin portion 228. In some implementations, the second dummy fin portion 230 may include multiple layers of materials, such as a first high-K material and a second high-K material, such as silicon carbon nitride.

As shown in FIG. 2F, a portion of the material of the second dummy fin portion 230 may be removed. For example, the one or more semiconductor processing tools (e.g., etching tool 104 and/or planarization tool 106) may remove the material of the second dummy fin portion 230 from surfaces of the material for the trench isolation structure 226 that are disposed above the active fin region 218. In some aspects, the material of the second dummy fin portion 230 may be removed from regions of the semiconductor device 200 except within gaps between fins. In some aspects, upper portions of the material of the second dummy fin portion 230 may be removed from the gaps between fins, as shown in FIG. 2F.

In some implementations, the first dummy fin portion 228 and the second dummy fin portion 230 may form one or more dummy fins. Additionally, or alternatively, the one or more dummy fins may include only a single material (e.g., a single dummy fin portion). The one or more dummy fins may provide isolation between the set of fins 220 and the isolation fin 224 and between the set of fins 222 and the isolation fin 224. The one or more dummy fins may be unattached from any fins 220, 222, or 224 and may be spaced (e.g., vertically and/or laterally) from the well 210 and the well 212.

As shown in FIG. 2G, a portion of the material of the trench isolation structure 226 may be removed. For example, the one or more semiconductor processing tools (e.g., etching tool 104 and/or planarization tool 106) may remove the material of the trench isolation structure 226 from surfaces of the active fin region 218. In some aspects, the material of the trench isolation structure 226 may be removed from regions of the semiconductor device 200 that are higher than a bottom surface of the active fin region 218.

As shown in FIG. 2H, a polysilicon structure 232 may be deposited around the set of fins 220, the set of fins 222, the isolation fin 224, and/or the second dummy fin portions 230. In some implementations, the polysilicon structure 232 may be a sacrificial material that may be fully or partially removed during a manufacturing process. For example, the polysilicon structure 232 may be removed and replaced by a metal gate structure during the manufacturing process.

In some implementations, the polysilicon structure 232 may be removed from a portion of the set of fins 220, the set of fins 222, the isolation fin 224, and/or the second dummy fin portions 230 at a cross section shown in FIG. 2H, such that a remaining portion of the polysilicon structure 232 is behind the set of fins 220, the set of fins 222, the isolation fin 224, and/or the second dummy fin portions 230. In this way, the portion of the set of the set of fins 220, the set of fins 222, the isolation fin 224, and/or the second dummy fin portions 230 may be exposed for deposition of one or more additional structures outside of the remaining portion of the polysilicon structure 232.

As shown in FIG. 2I, a sidewall structure 234 (e.g., a dummy sidewall structure) may be deposited on side surfaces and/or top surfaces of the set of fins 220, the set of fins 222, the isolation fin 224, the second dummy fin portions 230, and/or the trench isolation structures 226.

As shown in FIG. 2J, a portion of the sidewall structure 234 may be removed from top surfaces 236 of the set of fins 220, the set of fins 222, the isolation fin 224, and/or the second dummy fin portions 230.

As shown in FIG. 2K, portions of the active fin region 218 may be removed along various cross-sectional locations of the semiconductor device 200. The active fin region 218 is shown in dashed lines to show that the active fin region 218 remains in other cross-sectional locations of the semiconductor device 200. For example, the one or more semiconductor processing tools (e.g., etching tool 104) may remove the portions of the active fin region 218 of the set of fins 220 and the set of fins 222. In some implementations, a fin sidewall structure 238 may remain at a base of the removed portions of the active fin region 218. The fin sidewall structure 238 may include a remaining portion of the sidewall structure 234 and/or a portion of the active fin region 218.

As shown in FIG. 2L, the one or more semiconductor processing tools (e.g., the deposition tool 102 and/or the ion implantation tool 108) may form epitaxial structures 240 on between remaining portion of the active fin region 218 of the set of fins 220 and the set of fins 222. In some implementations, the one or more semiconductor processing tools deposit the material for the epitaxial structures 240 using chemical vapor deposition, physical vapor deposition, and/or epitaxial growth deposition, among other examples. In some aspects, the set of fins 220 and the set of fins 222 may be configured as source/drains based on forming the epitaxial structures 240. In some implementations, the one or more semiconductor processing tools may also form epitaxial structures 240 on the isolation fin 224 (e.g., at various other cross-sectional location of the semiconductor device 200).

As shown in FIG. 2M, the one or more semiconductor processing tools (e.g., the deposition tool 102) may form a dielectric layer 242 around and/or on the set of fins 220, the isolation fin 224, and the second of fins 222. In some implementations, the dielectric layer 242 includes an interlayer dielectric. The dielectric layer 242 may include a low-k material, such as silicon dioxide, silicon nitride, or silicon oxynitride, among other examples. The dielectric layer 242 may provide structural support to the semiconductor device 200 and electrical insulation between structures within the semiconductor device 200.

As shown in FIG. 2N, the one or more semiconductor processing tools (e.g., the etching tool 104) may remove a portion of the dielectric layer 242 and a portion of the trench isolation structure 226 from at least one side (e.g., multiple sides) of the isolation fin 224. For example, the one or more semiconductor processing tools may remove the portion of the trench isolation structure 226 that is above a bottom surface of the APT layer 214 of the isolation fin 224. In some implementations, the one or more processing tools may form a recessed portion 244 of the semiconductor device 200 that extends from the isolation fin 224 to one or more of the dummy fins (e.g., nearest dummy fins).

As shown in FIG. 2O, the one or more semiconductor processing tools (e.g., the deposition tool 102) may deposit isolation material on the at least one side of the isolation fin 224 after removing the portion the dielectric layer 242 and the portion of the trench isolation structure 226. In some implementations, the one or more semiconductor processing tools may deposit the isolation material on at least one side (e.g., on multiple sides) of the isolation fin 224 using chemical vapor deposition and/or physical vapor deposition, among other examples. In some aspects, the one or more semiconductor processing tools may deposit the isolation material on at least one side of the APT layer 214 of the isolation fin 224 and/or extending to the one or more dummy fins. The isolation material may include an oxide-based material (e.g., silicon oxide).

The isolation structure 246 may extend to a height that is above a top surface of the isolation fin 224. In some implementations, the isolation structure 246 extends to a top surface of the dielectric layer 242, through a silicon nitride layer that is disposed on the dielectric layer 242, and/or through another dielectric layer disposed on the silicon nitride layer.

In some implementations, the isolation structure 246 has a width, at a top portion of the isolation structure 246, that matches a pitch of the one or more dummy fins (e.g., in a range of approximately 30 nanometers to approximately 100 nanometers). In some implementations, the isolation structure 246 has a width, at a bottom portion of the isolation structure 246, that includes a first distance (e.g., in a range of approximately 10 nanometers to approximately 30 nanometers) from the isolation fin 224 to a dummy fin between the isolation fin 224 and the set of fins 220 and includes a second distance (e.g., in a range of approximately 5 nanometers to approximately 30) from the isolation fin 224 to a dummy fin between the isolation fin 224 and the set of fins 222. The first distance and the second distance may be equal or may be different.

The isolation structure 246 may have a total height in a range of approximately 200 nanometers to approximately 500 nanometers. In some implementations, the isolation structure 246 extends below a top surface of the trench isolation structure 226 with a height in a range of approximately 100 nanometers to approximately 150 nanometers. In this way, the isolation structure 246 extends to a depth that is sufficient to surround and/or isolate the APT layers 214 of the isolation fin 224 and to provide lateral insulation between APT layers 214 of set of fins 220 and the set of fins 222. In some implementations, the isolation structure 246 may be configured to extend below a bottom surface of the APT layers 214 by an amount in a range of approximately 5 nanometers to approximately 30 nanometers to account for potential variation in etching and to improve a likelihood of extending at least to the bottom surface of the APT layers 214.

As shown in FIGS. 2A-2O, the semiconductor device includes an isolation structure (e.g., an isolation oxide) on one or more sides of the isolation fin 224 that is disposed between a first set of fins 220 and a second set of fins 222 that may include source/drains (e.g., having a same polarity) or other devices.

FIG. 2P shows of top view of one or more implementations of the semiconductor device 200. As shown in FIG. 2P, a set of fins (e.g., the set of fins 220, the isolation fin 224, and the set of fins 222) may be formed as substantially parallel fins. The one or more fins may be separated by one or more dummy fins 250 (e.g., including the first dummy fin portion 228 and/or the second dummy fin portion 230).

The one or more fins may have one or more epitaxial structures disposed thereon. For example, the one or more of the fins may have a first type of epitaxial structure 240A (e.g., an N-type epitaxial structure) and a second type of epitaxial structure 240B (e.g., a P-type epitaxial structure).

The semiconductor device 200 may also include a set of polysilicon gates 232 disposed orthogonally to the one or more fins. In some implementations, the isolation structure 246 may be disposed on the isolation fin 224 based on cutting away a portion of the polysilicon gates 232 between two of the fins 222 and/or extending between two dummy fins 250.

FIG. 2Q shows an isometric view of the semiconductor device 200. As shown in FIG. 2Q, in some implementations, the isolation structure 246 may include a cut poly (CPO) structure that is disposed in place of a polysilicon gate in an isolation area of the semiconductor device 200. For example, forming the recessed portion 244 described in connection with FIG. 2N may include cutting (e.g., etching away) a portion of the polysilicon structure 232 in the isolation area that includes the isolation structure 246. Forming the isolation structure 246 may include depositing isolation material in the isolation area in place of the removed portion of the polysilicon structure 232. The isolation structure 246 may surround at least a portion of the isolation fins 224 (e.g., instead of being deposited in place of the isolation fins 224).

The semiconductor device 200 also includes the dielectric layer 242 deposited outside of the isolation structure 246. In some implementations, the epitaxial structures 240 (e.g., source/drains) may be formed on the set of fins 220 between polysilicon structures 232 before depositing the dielectric layer 242 around the epitaxial structures 240. In some implementations, the polysilicon structures 232 may be removed and then filled with a gate structure (e.g., a metal gate structure) in a later stage of a manufacturing process.

As indicated above, FIGS. 2A-2P are provided as an example. Other examples may differ from what is described with regard to FIGS. 2A-2P. The number and arrangement of devices, layers, and/or materials shown in FIGS. 2A-2P are provided as an example. In practice, there may be additional devices, layers, and/or materials, fewer devices, layers, and/or materials, different devices, layers, and/or materials, or differently arranged devices, layers, and/or materials than those shown in FIGS. 2A-2P.

Figure 3A:
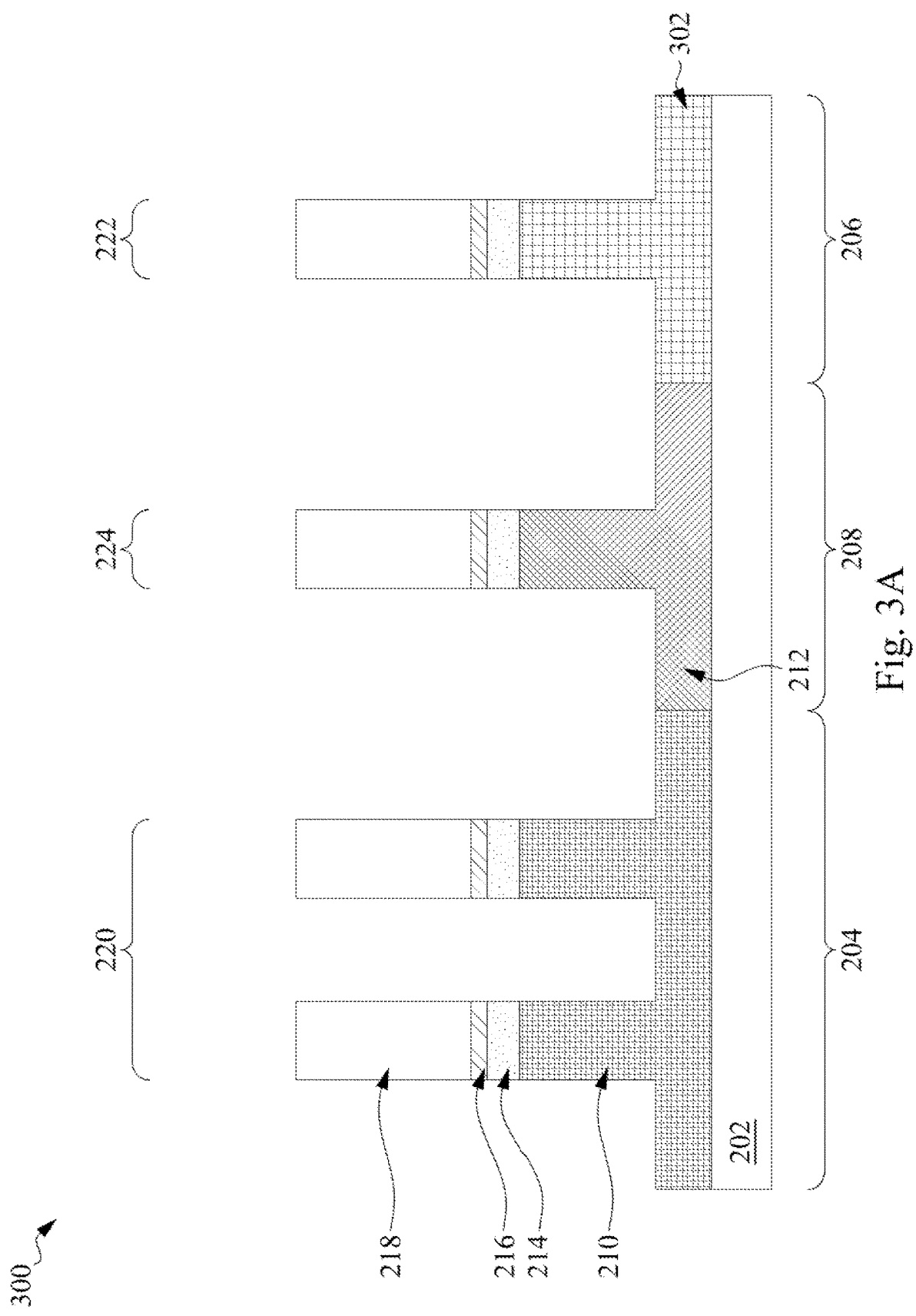
FIGS. 3A-3P are diagrams of an example semiconductor device described herein.
Figure 3B:
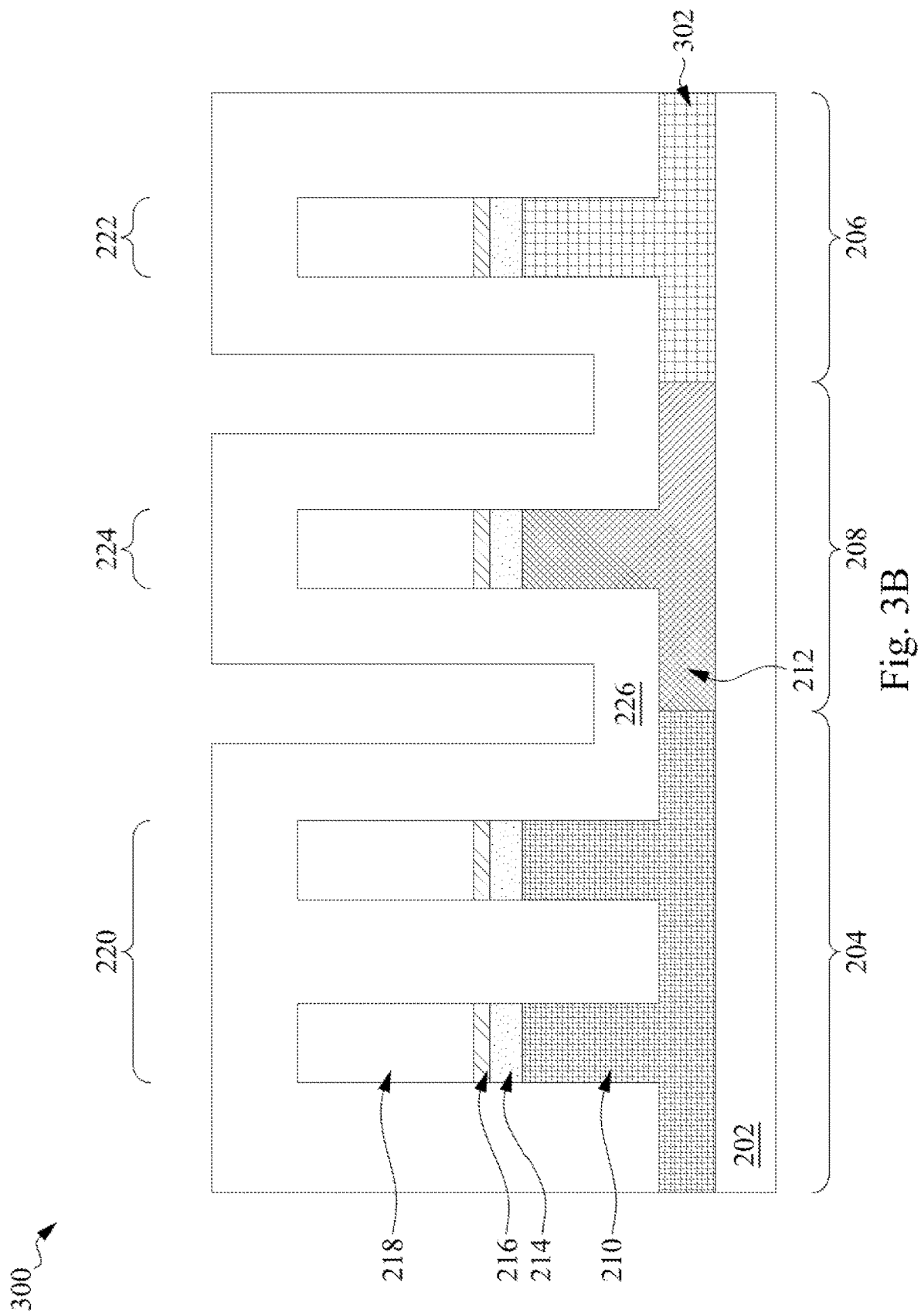
Figure 3C:
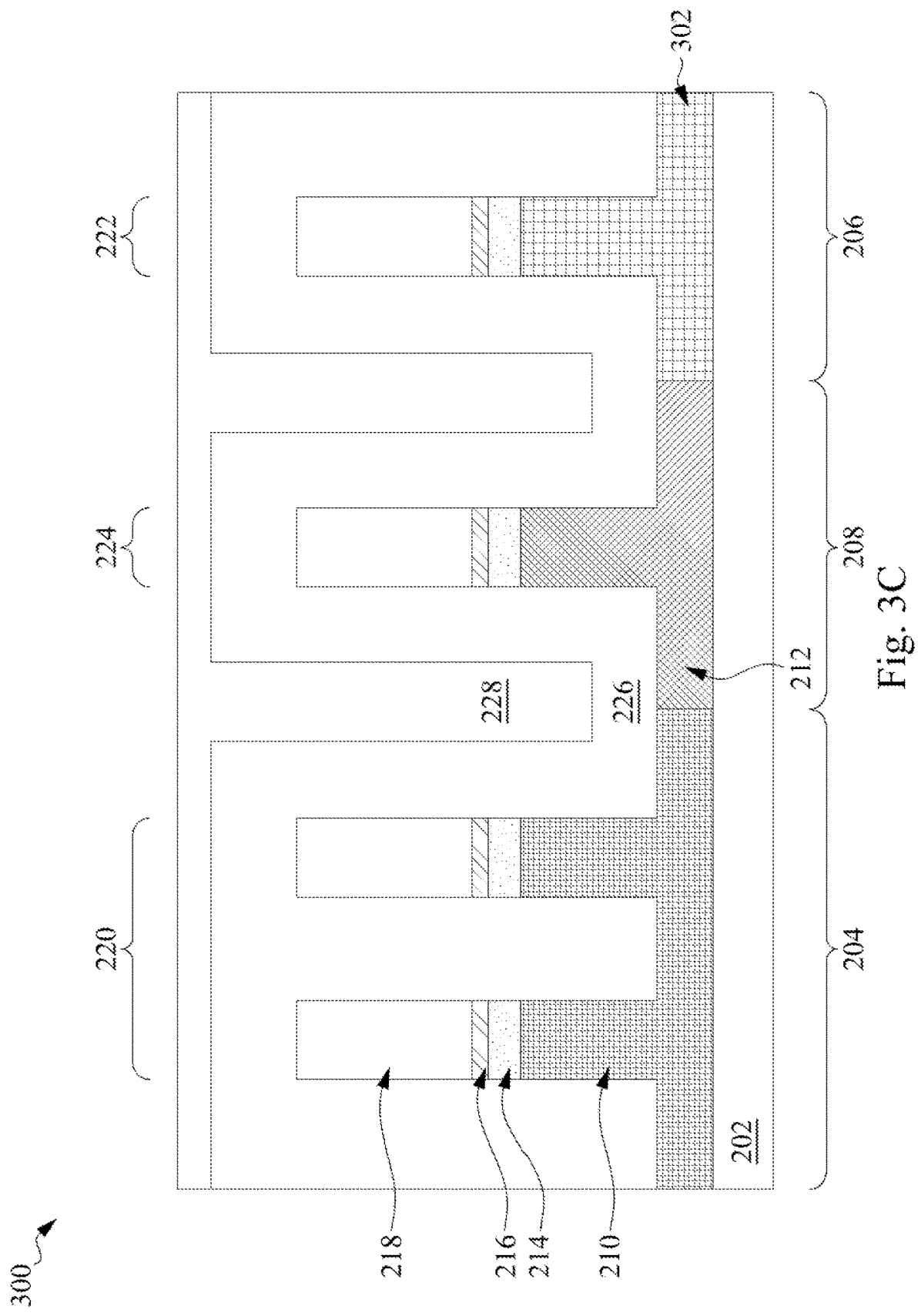
Figure 3D:
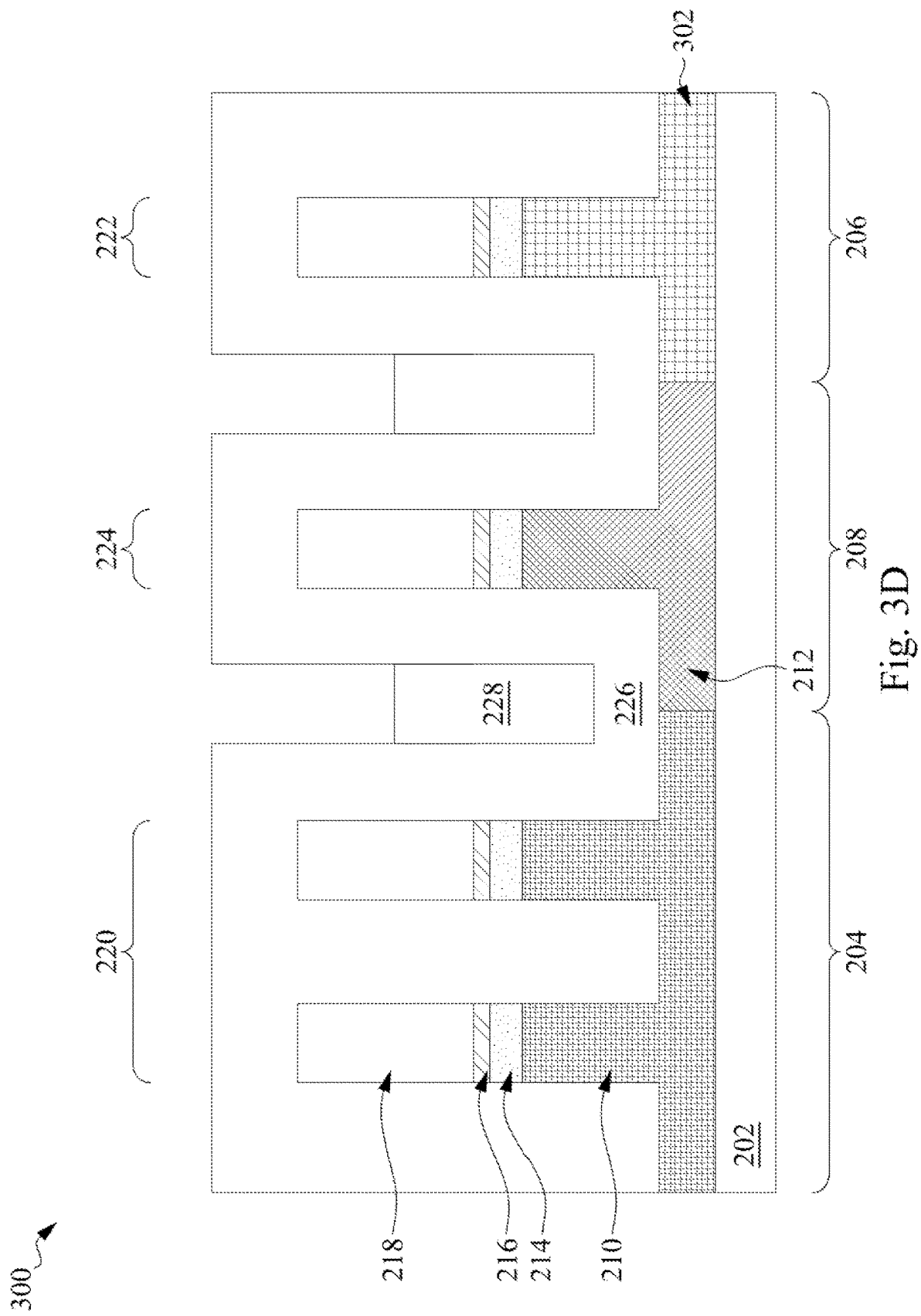
Figure 3E:
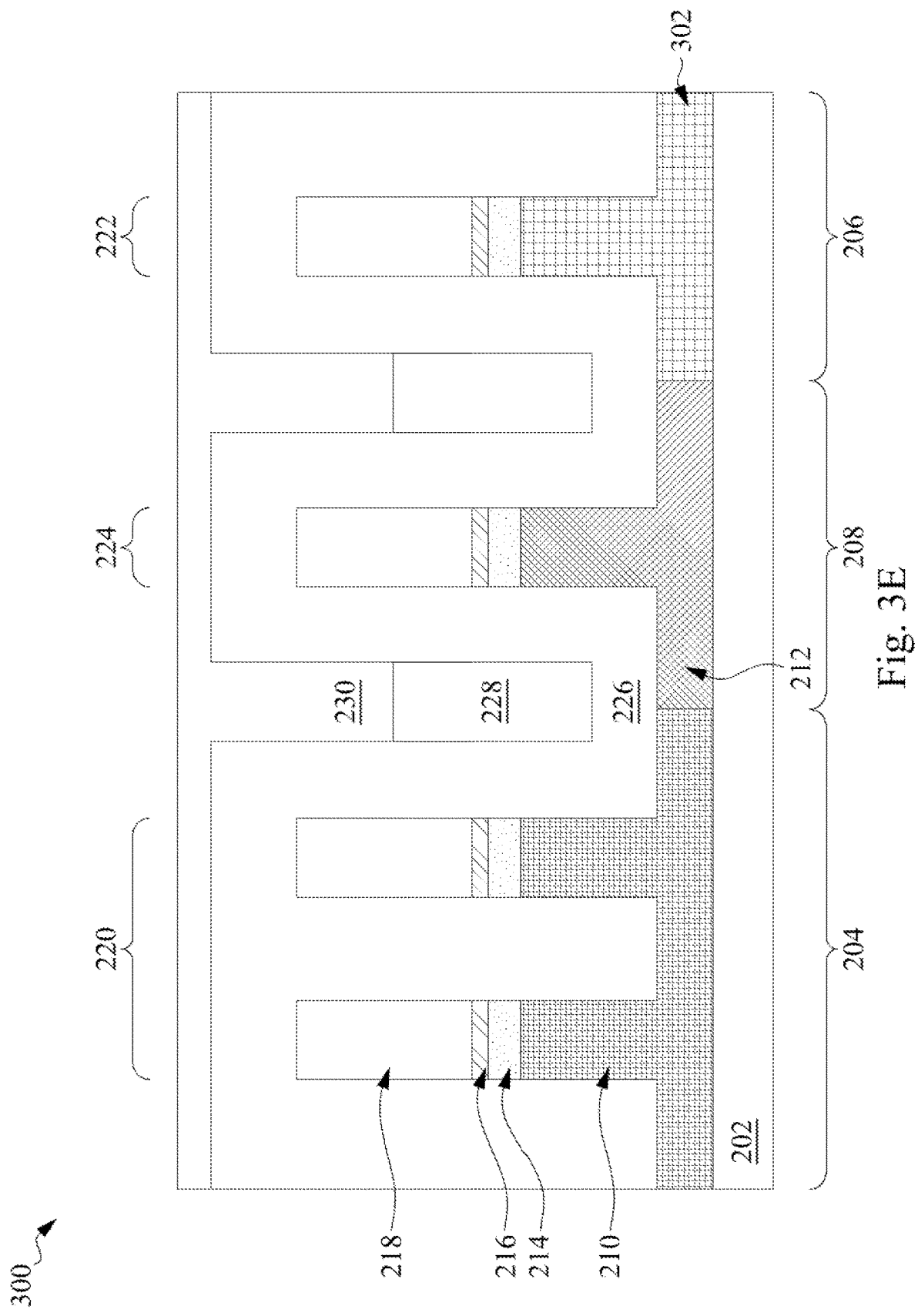
Figure 3F:
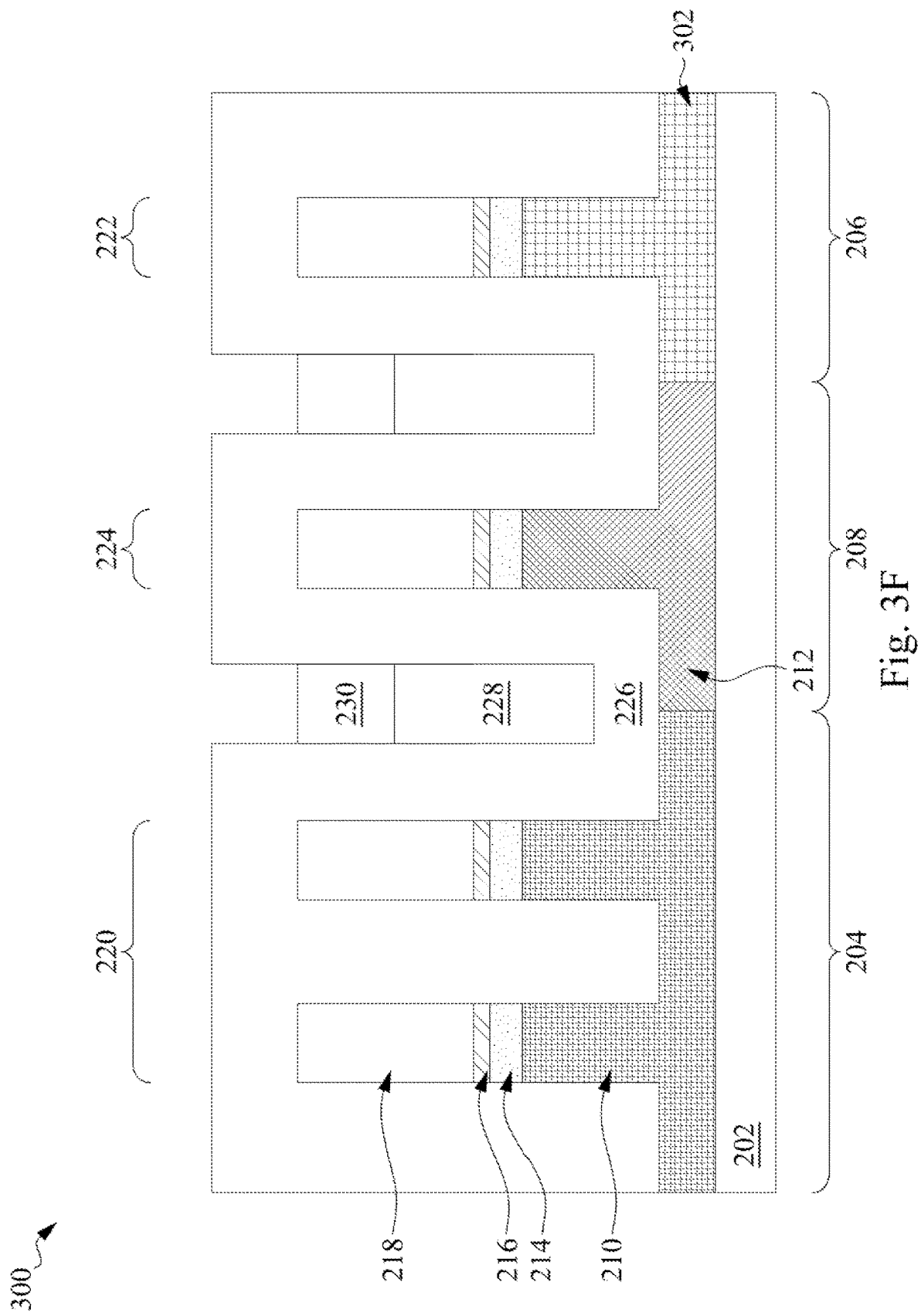
Figure 3G:
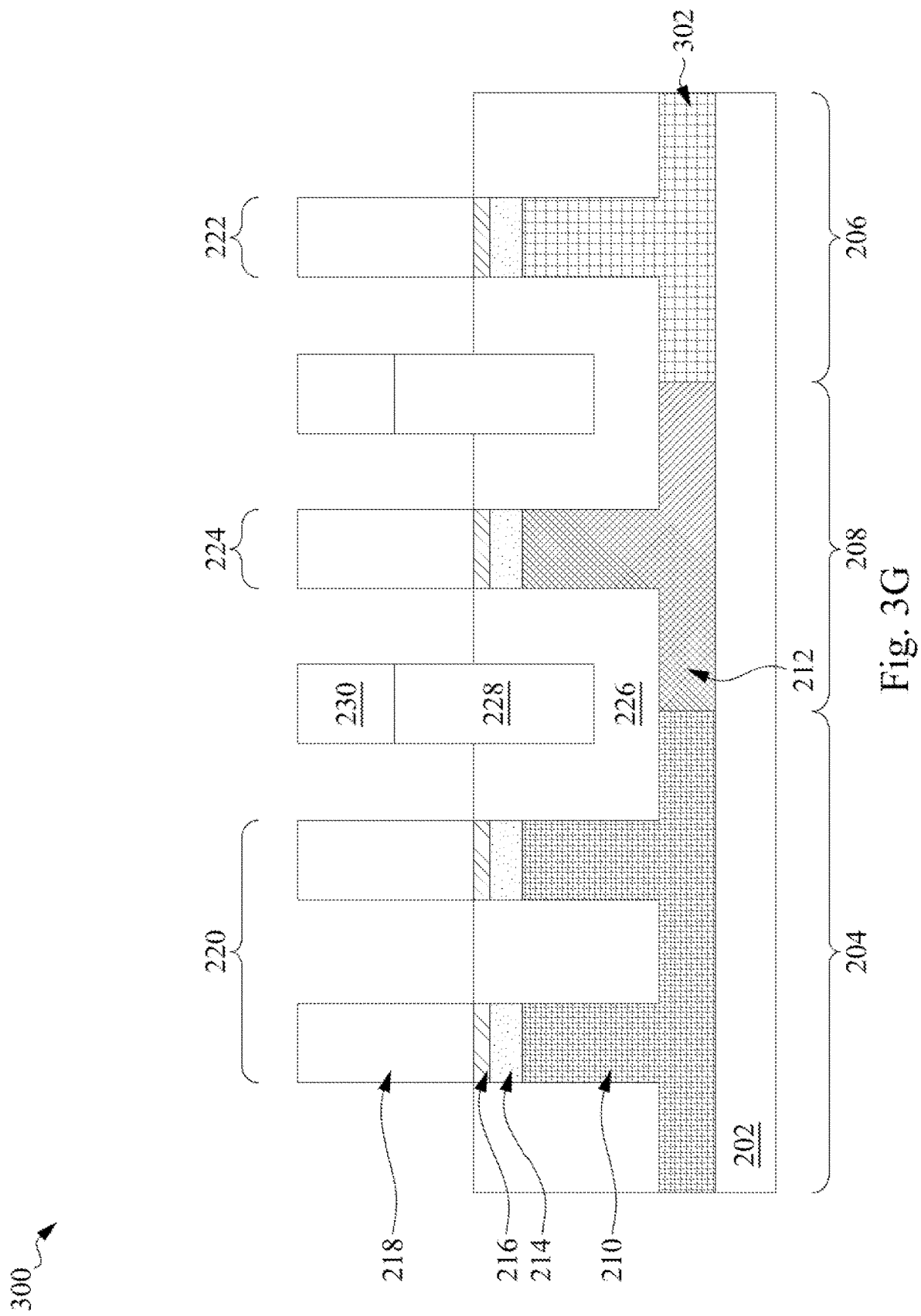
Figure 3H:
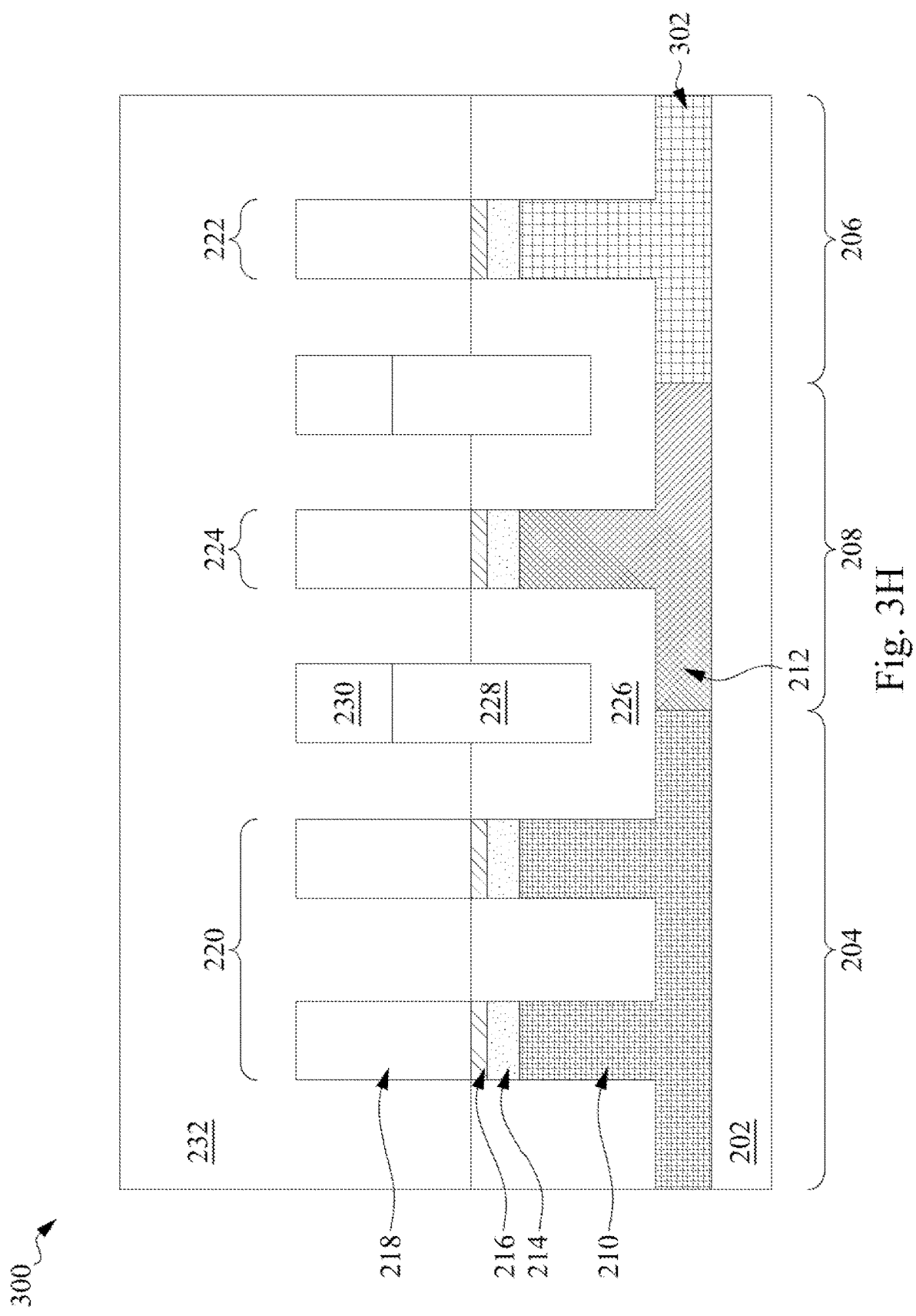
Figure 3I:
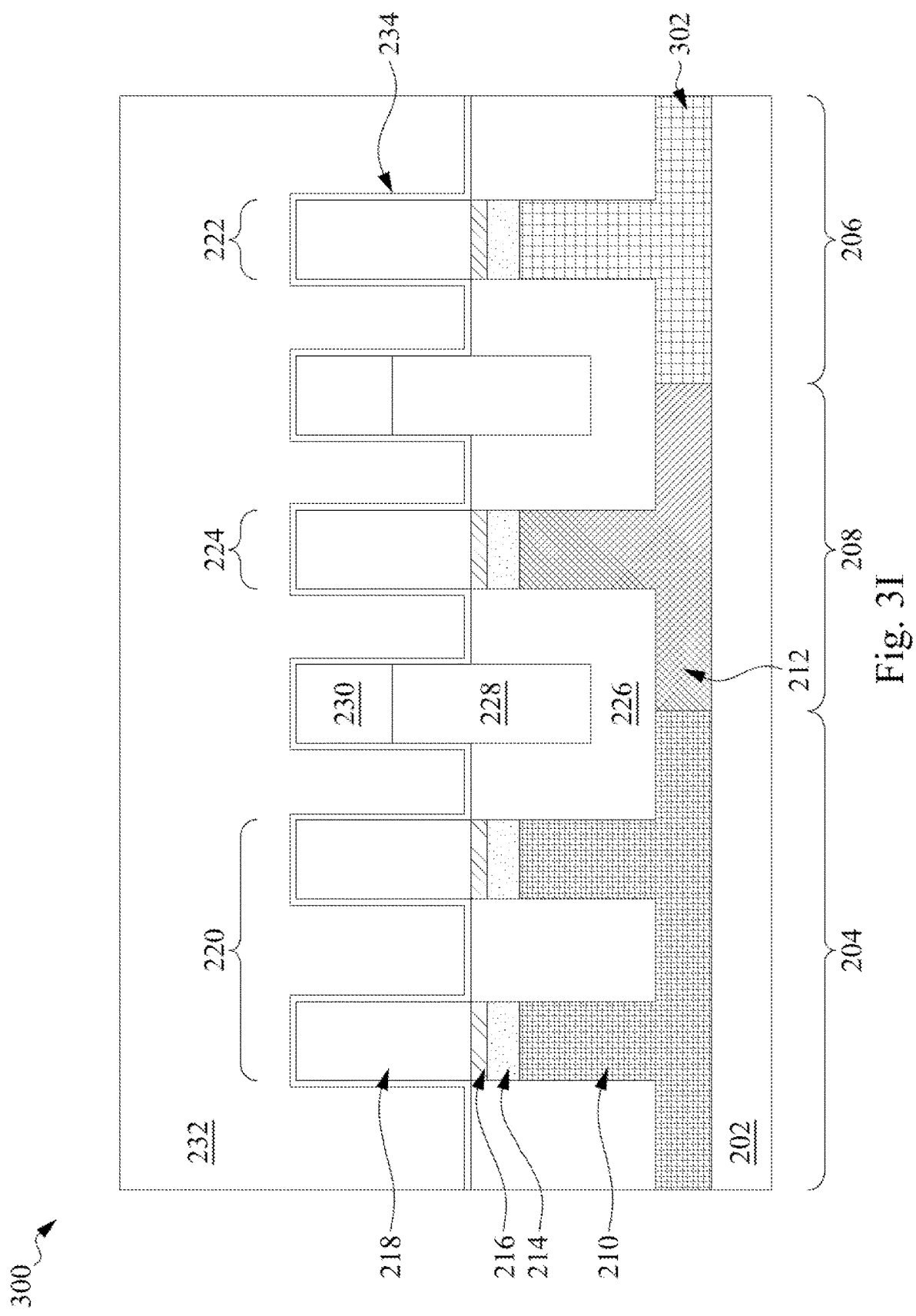
Figure 3J:
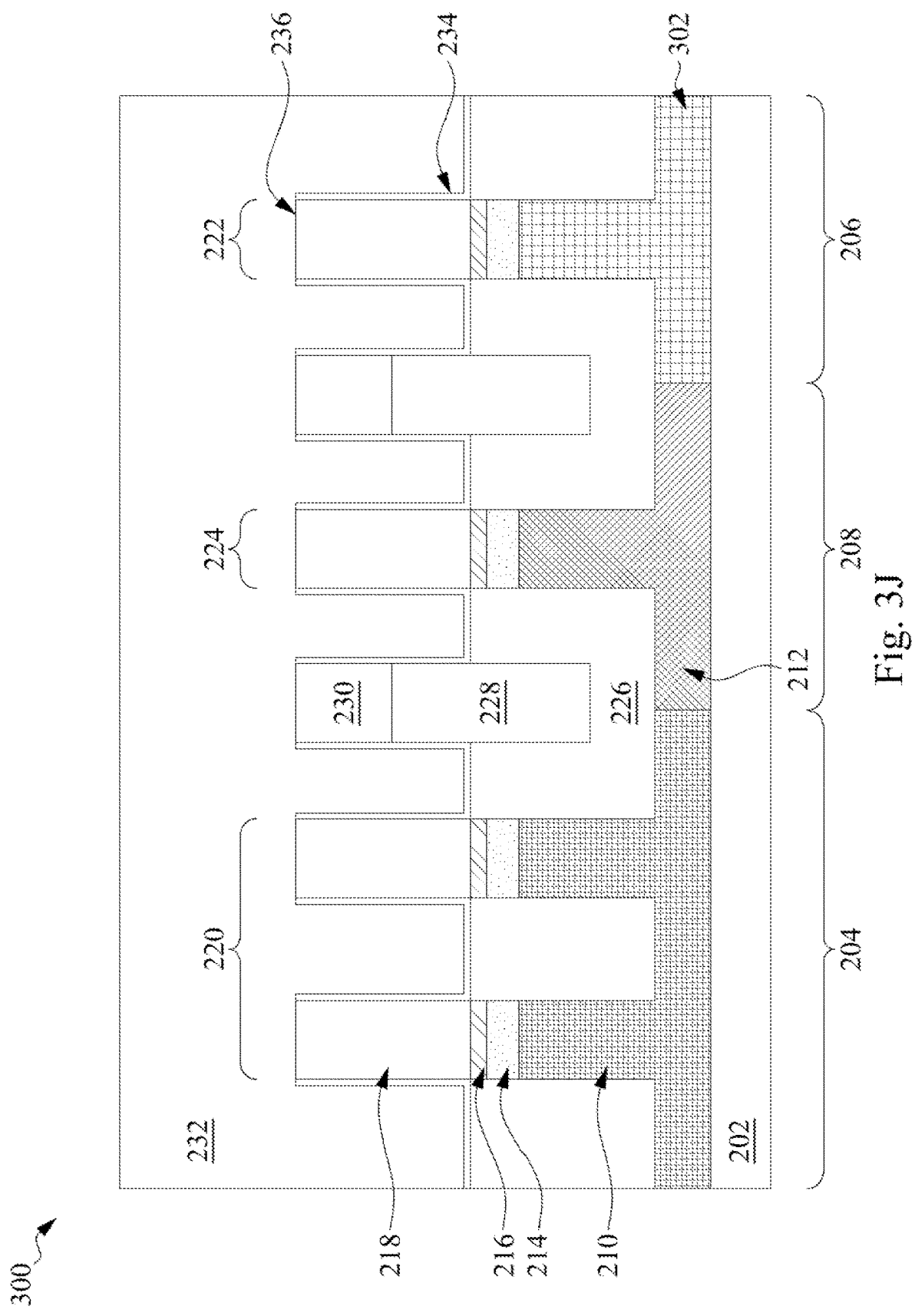
Figure 3K:
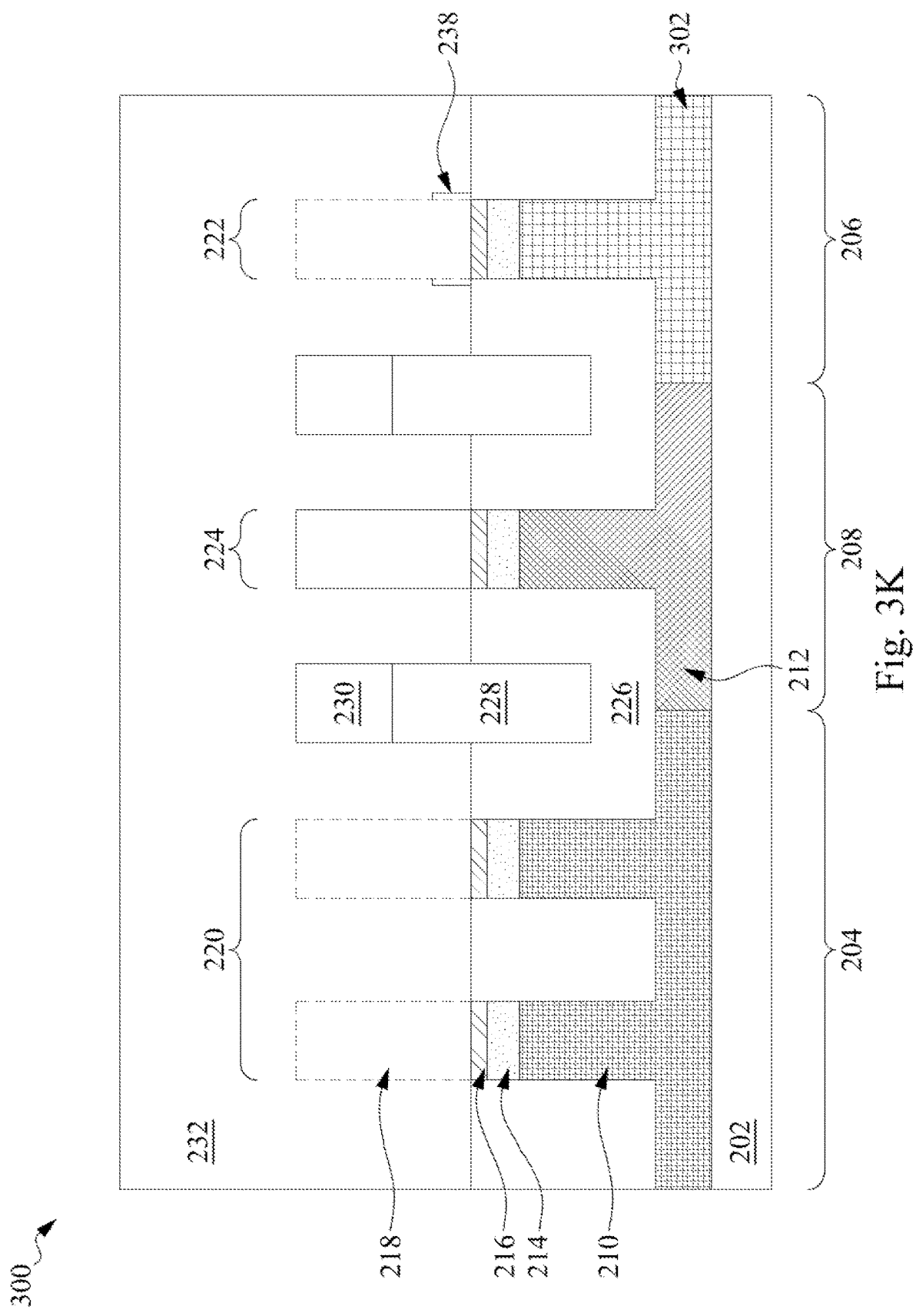
Figure 3L:
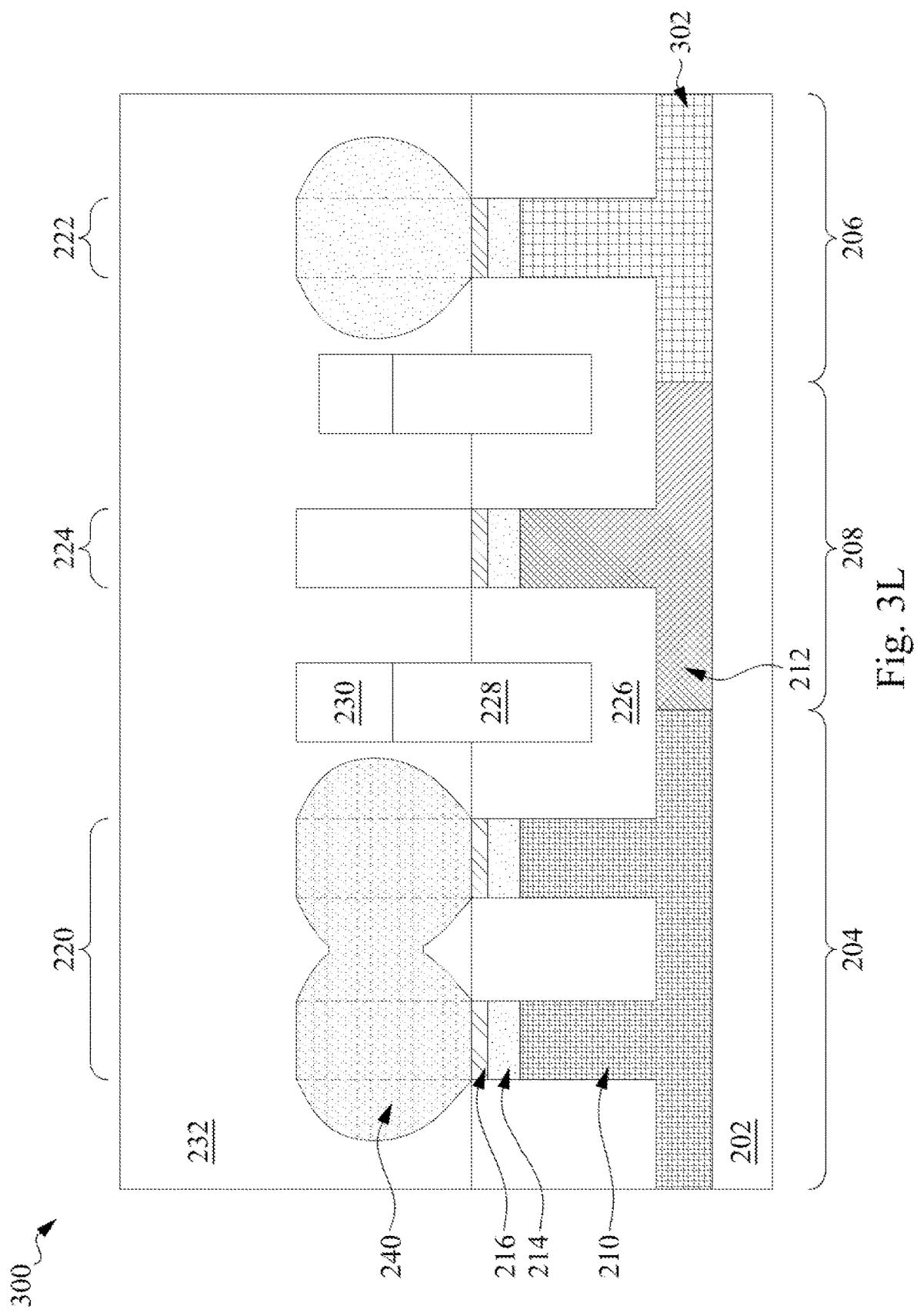
Figure 3M:
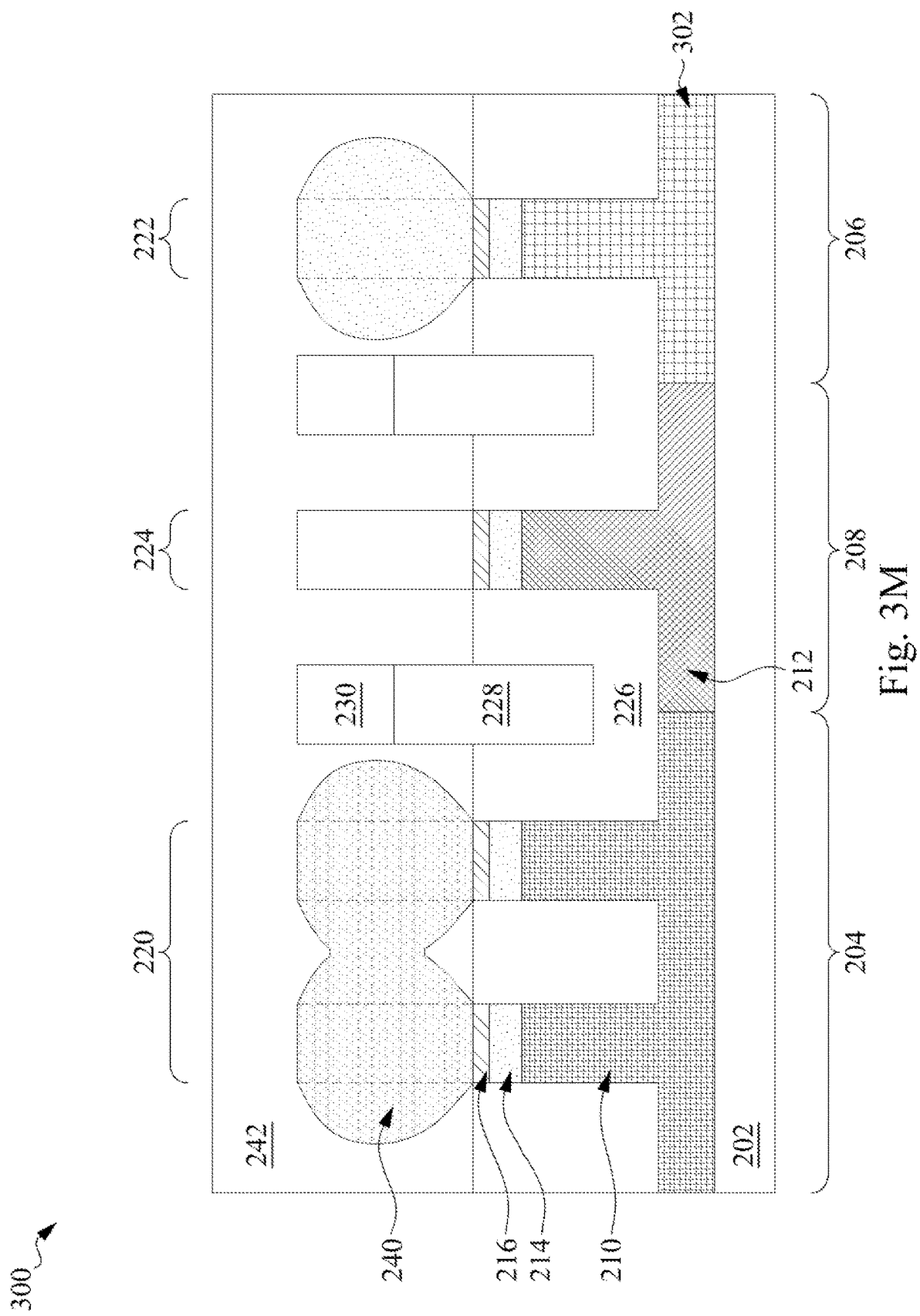
Figure 3O:
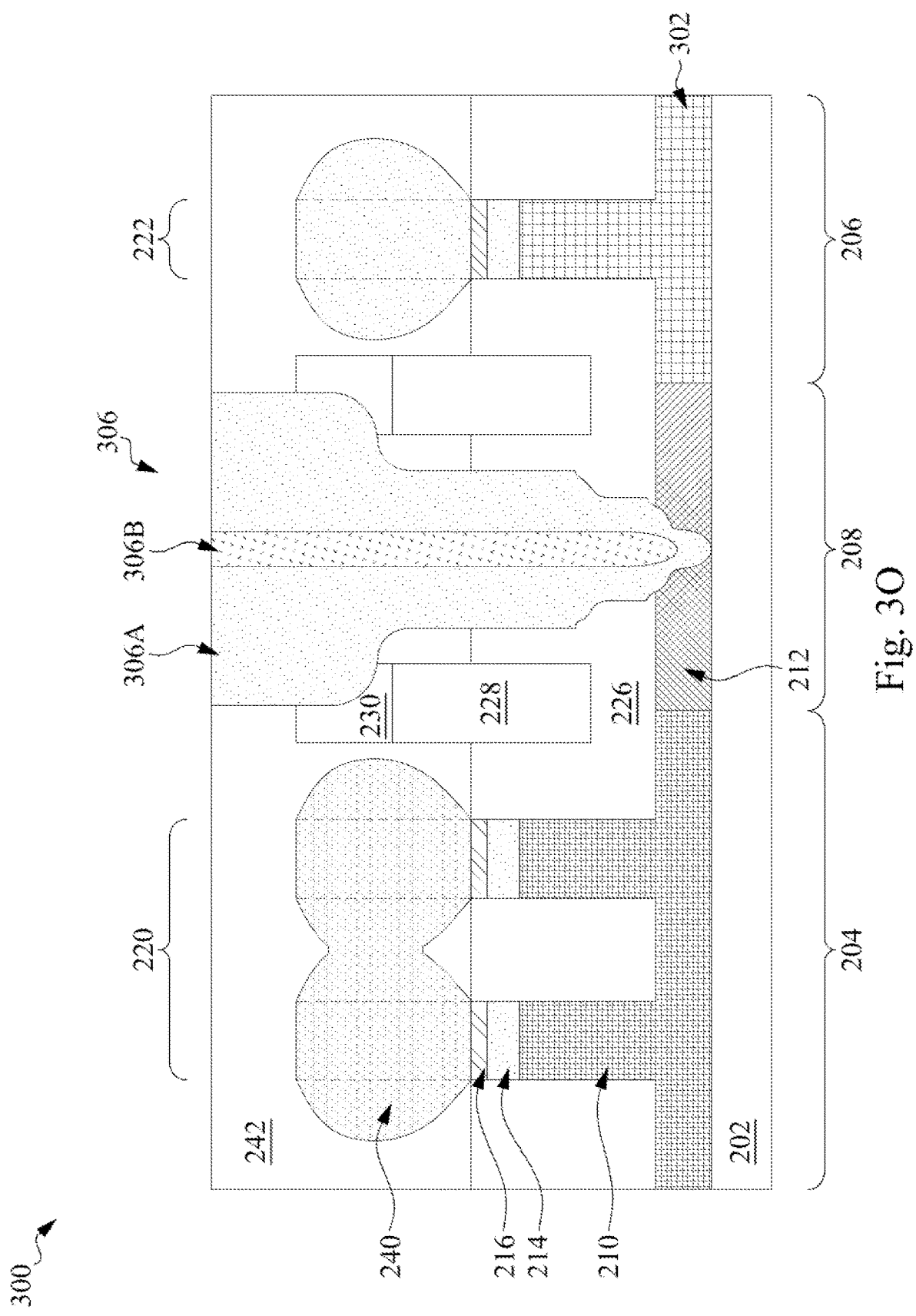
Figure 3P:
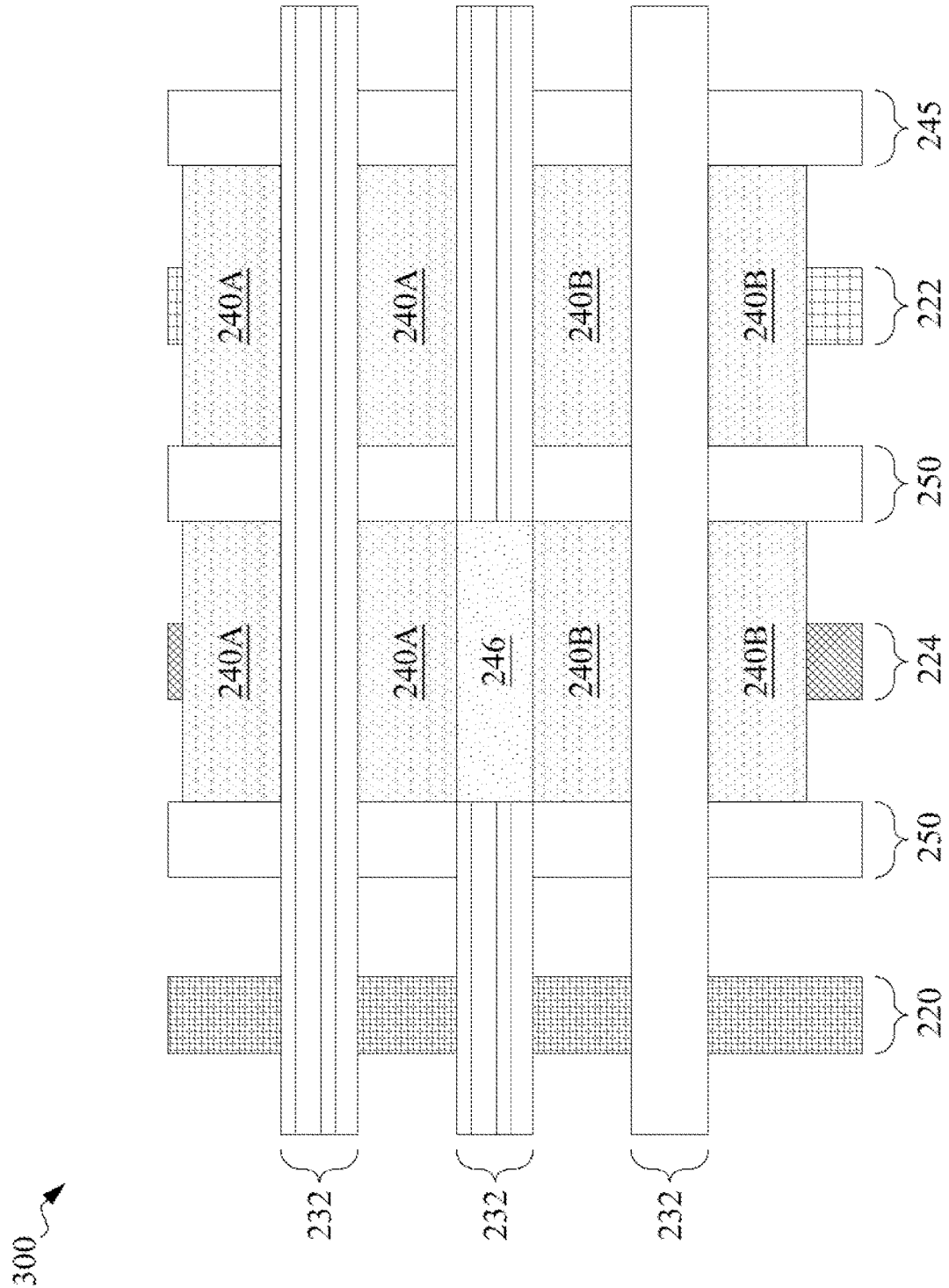

FIGS. 3A-3P are diagrams of an example semiconductor device 300 described herein. Semiconductor device 300 may be manufactured using an example process as shown in FIGS. 3A-3P. The example process may include one or more operations not shown (e.g., lithography operations, operations performed on different portions of an electronic device that includes the semiconductor device 300) and/or operations shown in the example process may be performed in a different order from the order shown in FIGS. 3A-3P. The semiconductor device 300 may include one or more additional devices, structures, and/or layers not shown in FIGS. 3A-3P. For example, the semiconductor device 300 may include additional layers and/or dies formed on layers above and/or below the portion of the semiconductor device 300 shown in FIGS. 3A-3P. Additionally, or alternatively, one or more additional semiconductor structures and/or semiconductor devices may be formed in a same layer, with a lateral displacement, of a device that includes the semiconductor device 300 shown in FIGS. 3A-3P. Elements shown in FIGS.

3A-3P having a same reference number as those in FIGS. 2A-2Q may have a same or similar composition and/or function.

As shown in FIG. 3A, the semiconductor device 300 includes a substrate 202 having a MOS portion 204 and a MOS portion 206 having an opposite polarity as the MOS portion 204. The semiconductor device 300 also includes a MOS portion 208. The MOS portion 208 may be an undoped portion of the semiconductor device 300 or may have a same polarization as the MOS portion 204 or the MOS portion 206. The MOS portion 204 includes a well 210 disposed on the substrate 202, the MOS portion 206 includes a well 302 disposed on the substrate 202, and the MOS portion 208 includes a well 212 disposed on the substrate. The well 302 has an opposite polarity as the well 210. The well 212 may be an undoped portion of the substrate 202 or may have a same polarity as the well 210 or the well 302. The well 302 and the well 210 may be separated by the well 212 or may meet at an interface (e.g., in implementations where the well 212 has a same polarity as the well 210 or the well 302. The substrate 202, the well 302, the well 210, and/or the well 212 may have one or more characteristics and/or may be formed using similar procedures as the substrate 202, the well 210, and/or the well 212 described in connection with FIG. 2A.

The semiconductor device 300 may also include fin stacks on top of the well 302, the well 210, and/or the well 212. The fin stacks may include an APT layer 214, a barrier implant region 216, and an active fin region 218, which may have one or more characteristics and/or may be formed using similar procedures as the APT layer 214, a barrier implant region 216, and the active fin region 218 described in connection with FIG. 2A. The fin stacks may be formed into a first set of fins 220, a second set of fins 222, and/or an isolation fin 224 (e.g., using similar procedures to those described in connection with FIG. 2A).

As shown in FIG. 3B, material for a set of trench isolation structures 226 may be disposed on surfaces of the set of fins 220, the set of fins 222, and the isolation fin 224. For example, the material for the set of trench isolation structures 226 may fill one or more gaps between fins (e.g., between fins of the set of fins 220) and/or may leave one or more gaps (e.g., recessed portions) between fins (e.g., between the isolation fin 224 and a nearest fin of the set of fins 220 and/or between the isolation fin 224 and the set of fins 222). The one or more semiconductor processing tools (e.g., the deposition tool 102) may deposit the material for the set of trench isolation structures 226 using chemical vapor deposition or physical vapor deposition, among other examples. In some implementations, the material for a set of trench isolation structures 226 includes silicon oxide, silicon germanium, silicon carbon-nitride, silicon nitride, and/or a high-K material.

As shown in FIG. 3C, a first dummy fin portion 228 may be deposited in the gaps between fins. For example, the one or more semiconductor processing tools (e.g., deposition tool 102) may deposit material for the first dummy fin portion 228 using PVD or CVD. In some implementations, the material for the first dummy fin portion 228 may include Silicon carbon nitride, a high-K material, poly 2-ethyl-2-oxazoline (PEOx), and/or another passivation layer material to reduce reactivity between materials on opposite sides of the first dummy fin portion 228.

As shown in FIG. 3D, a portion of the material of the first dummy fin portion 228 may be removed. For example, the one or more semiconductor processing tools (e.g., etching tool 104 and/or planarization tool 106) may remove the material of the first dummy fin portion 228 from surfaces of the material for the trench isolation structure 226 that are disposed above the active fin region 218. In some aspects, the material of the first dummy fin portion 228 may be removed from regions of the semiconductor device 300 except within gaps between fins. In some aspects, upper portions of the material of the first dummy fin portion 228 may be removed from the gaps between fins, as shown in FIG. 3D.

As shown in FIG. 3E, a second dummy fin portion 230 may be deposited on top of the first dummy fin portion 228 (e.g., within gaps between fins). For example, the one or more semiconductor processing tools (e.g., deposition tool 102) may deposit material for the second dummy fin portion 230 using PVD or CVD. In some implementations, the material for the second dummy fin portion 230 may include silicon carbon nitride, a high-K material, poly 2-ethyl-2-oxazoline (PEOx), and/or another passivation layer material to reduce reactivity between materials on opposite sides of the first dummy fin portion 228. In some implementations, the second dummy fin portion 230 may include multiple layers of materials, such as a first high-K material and a second high-K material, such as silicon carbon nitride.

As shown in FIG. 3F, a portion of the material of the second dummy fin portion 230 may be removed. For example, the one or more semiconductor processing tools (e.g., etching tool 104 and/or planarization tool 106) may remove the material of the second dummy fin portion 230 from surfaces of the material for the trench isolation structure 226 that are disposed above the active fin region 218. In some aspects, the material of the second dummy fin portion 230 may be removed from regions of the semiconductor device 300 except within gaps between fins. In some aspects, upper portions of the material of the second dummy fin portion 230 may be removed from the gaps between fins, as shown in FIG. 3F.

In some implementations, the first dummy fin portion 228 and the second dummy fin portion 230 may form a dummy fin. Additionally, or alternatively, the dummy fin may include only a single material (e.g., a single dummy fin portion). The dummy fin may provide isolation between the set of fins 220 and the isolation fin 224 and between the set of fins 222 and the isolation fin 224. The one or more dummy fins may be unattached from any fins 220, 222, or 224 and may be spaced (e.g., vertically and/or laterally) from the well 210 and the well 212.

As shown in FIG. 3G, a portion of the material of the trench isolation structure 226 may be removed. For example, the one or more semiconductor processing tools (e.g., etching tool 104 and/or planarization tool 106) may remove the material of the trench isolation structure 226 from surfaces of the active fin region 218. In some aspects, the material of the trench isolation structure 226 may be removed from regions of the semiconductor device 300 that are higher than a bottom surface of the active fin region 218.

As shown in FIG. 3H, a polysilicon structure 232 may be deposited around the set of fins 220, the set of fins 222, the isolation fin 224, and/or the second dummy fin portions 230. In some implementations, the polysilicon structure 232 may be a sacrificial material that may be fully or partially removed during a manufacturing process. For example, the polysilicon structure 232 may be removed and replaced by a metal gate structure during the manufacturing process.

In some implementations, the polysilicon structure 232 may be removed from a portion of the set of fins 220, the set of fins 222, the isolation fin 224, and/or the second dummy fin portions 230 at a cross section shown in FIG. 3H, such that a remaining portion of the polysilicon structure 232 is behind the set of fins 220, the set of fins 222, the isolation fin 224, and/or the second dummy fin portions 230. In this way, the portion of the set of the set of fins 220, the set of fins 222, the isolation fin 224, and/or the second dummy fin portions 230 may be exposed for deposition of one or more additional structures outside of the remaining portion of the polysilicon structure 232.

As shown in FIG. 3I, a sidewall structure 234 (e.g., a dummy sidewall structure) may be deposited on side surfaces and/or top surfaces of the set of fins 220, the set of fins 222, the isolation fin 224, the second dummy fin portions 230, and/or the trench isolation structures 226.

As shown in FIG. 3J, a portion of the sidewall structure 234 may be removed from top surfaces 236 of the set of fins 220, the set of fins 222, the isolation fin 224, and/or the second dummy fin portions 230.

As shown in FIG. 3K, portions of the active fin region 218 may be removed along various cross-sectional locations of the semiconductor device 300. The active fin region 218 is shown in dashed lines to show that the active fin region 218 remains in other cross-sectional locations of the semiconductor device 300. For example, the one or more semiconductor processing tools (e.g., etching tool 104) may remove the portions of the active fin region 218 of the set of fins 220 and the set of fins 222. In some implementations, a fin sidewall structure 238 may remain at a base of the removed portions of the active fin region 218. The fin sidewall structure 238 may include a remaining portion of the sidewall structure 234 and/or a portion of the active fin region 218.

As shown in FIG. 3L, the one or more semiconductor processing tools (e.g., the deposition tool 102 and/or the ion implantation tool 108) may form epitaxial structures 240 on between remaining portion of the active fin region 218 of the set of fins 220 and the set of fins 222. In some implementations, the one or more semiconductor processing tools deposit the material for the epitaxial structures 240 using chemical vapor deposition, physical vapor deposition, and/or epitaxial growth deposition, among other examples. In some aspects, the set of fins 220 and the set of fins 222 may be configured as source/drains based on forming the epitaxial structures 240. In some implementations, the one or more semiconductor processing tools may also form epitaxial structures 240 on the isolation fin 224 (e.g., at various other cross-sectional location of the semiconductor device 300).

As shown in FIG. 3M, the one or more semiconductor processing tools (e.g., the deposition tool 102) may form a dielectric layer 242 around and/or on the set of fins 220, the isolation fin 224, and the second of fins 222. In some implementations, the dielectric layer 242 includes an interlayer dielectric. The dielectric layer 242 may include a low-k material, such as silicon dioxide, silicon nitride, or silicon oxynitride, among other examples. The dielectric layer 242 may provide structural support to the semiconductor device 300 and electrical insulation between structures within the semiconductor device 300.

As shown in FIG. 3N, the one or more semiconductor processing tools (e.g., the etching tool 104) may remove a portion of the dielectric layer 230, a portion of the trench isolation structure 226, a portion of the isolation fin 224, and/or a portion of the well 212 (e.g., to separate different well types at an interface) to form a recessed portion 304. In some implementations, the one or more semiconductor processing tools may use multiple etching steps to form the recessed portion 304. For example, the one or more semiconductor processing tools may perform a first etching operation, on a relatively wide portion of the semiconductor device, to remove an upper portion of a recessed portion 304. The one or more semiconductor processing tools may perform a second etching operation, on a portion of the semiconductor device 300 that is narrower than the first etching operation, to remove a middle portion of the recessed portion 304. The one or more semiconductor processing tools may perform additional etching operations on progressively narrower portions of the semiconductor device 300 to form a funnel-shaped recessed portion 304.

As shown in FIG. 3O, the one or more semiconductor processing tools (e.g., the deposition tool 102) may deposit isolation material within the recessed portion 304. In some implementations, the one or more semiconductor processing tools may deposit the isolation material, to form an isolation structure 306, using chemical vapor deposition and/or physical vapor deposition, among other examples.

The isolation structure 246 may include a CPO structure that is disposed in place of a polysilicon gate in an isolation area of the semiconductor device 300. For example, forming the recessed portion 244 described in connection with FIG. 3N may include cutting (e.g., etching away) a portion of the polysilicon structure 232 in the isolation area that includes the isolation structure 306. Forming the isolation structure 306 may include depositing isolation material in the isolation area in place of the removed portion of the polysilicon structure 232. The isolation structure 306 may also be deposited in place of the isolation fin 224.

The one or more semiconductor processing tools may deposit the isolation structure 306 in multiple steps. For example, the one or more semiconductor processing tool may deposit a liner material to improve adhesion and/or to reduce peeling. Additionally, the one or more semiconductor processing tools may form an outer portion 306A of the isolation structure 306 in a first operation and may form an inner portion 306B within the outer portion 306A. For example, an etching tool may remove an inner portion of material used to form the outer portion 306A, and a deposition tool may deposit the material used to form the inner portion 306B in place of the removed inner portion of the material used to form the outer portion 306A. The outer portion 306A may be formed of a different material than the inner portion 306B

The isolation structure 306 may be formed of a material that includes a ceramic material, silicon and nitrogen (e.g., silicon nitride), silicon and carbon (silicon carbide), aluminum and nitrogen (aluminum nitride), aluminum and oxygen (e.g., aluminum oxide), silicon, oxygen, and nitrogen, and/or silicon oxygen, carbon, and nitrogen, among other examples.

Based at least in part on a position of the isolation structure 306 between the set of fins 220 and the set of fins 222, the isolation structure 306 may reduce electron leaking between p-FETs and n-FETs of the semiconductor device. The funnel shape of the isolation structure 306 may improve electron leaking reduction based on having a greatest thickness (e.g., a greatest insolation) at a height, relative to the substrate 302, that is approximately a same height as the epitaxial structures 240 that may otherwise be sources of electron leaking.

The isolation structure 306 has a first width (e.g., in a range of approximately 40 nanometers to approximately 100 nanometers above the epitaxial structures 240, which is greater than a second width (e.g., in a range of approximately 15 nanometers to approximately 50 nanometers) of the isolation structure 306 within the trench isolation structure 306). The second width is greater than a third width (e.g., in a range of approximately 10 nanometers to approximately 30 nanometers) of the isolation structure 306 within the well 212 (e.g., at the interface).

The isolation structure may have a height in a range of approximately 300 nanometers to approximately 300 nanometers. In some implementations, the isolation structure 306 may penetrate into the well 302 and the well 212 at a depth in a range of approximately 10 nanometers to approximately 30 nanometers. In some implementations, a lowest point of the isolation structure 306 may be a distance (e.g., in a range of approximately 5 nanometers to approximately 20 nanometers) below a lowest point of the trench isolation structure 306 (e.g., based on a bottom surface of the trench isolation structure 226 being curved). The isolation structure 306 may have a depth below a top surface of the trench isolation structure 306 and/or a bottom surface of the set of fins 220 and the set of fins 222, with the depth being a distance in a range of approximately 100 nanometers to approximately 250 nanometers.

As shown in FIGS. 3A-3P, the semiconductor device includes an isolation structure (e.g., an isolation oxide) disposed in place of the isolation fin 224 that is disposed between a first set of fins 220 and a second set of fins 222 that may include source/drains having opposite polarization.

FIG. 3M shows of top view of one or more implementations of the semiconductor device 300. As shown in FIG. 3M, a set of fins (e.g., the set of fins 220, the isolation fin 224, and the set of fins 222) may be formed as substantially parallel fins. The one or more fins may be separated by one or more dummy fins 250 (e.g., including the first dummy fin portion 228 and/or the second dummy fin portion 230).

The one or more fins may have one or more epitaxial structures disposed thereon. For example, the one or more of the fins may have a first type of epitaxial structure 240A (e.g., an N-type epitaxial structure) and a second type of epitaxial structure 240B (e.g., a P-type epitaxial structure).

The semiconductor device 300 may also include a set of polysilicon gates 232 disposed orthogonally to the one or more fins. In some implementations, the isolation structure 306 may be disposed on the isolation fin 224 based on cutting away a portion of the polysilicon gates 232 between the first type of epitaxial structure 240A and the second type of epitaxial structure 240B.

As indicated above, FIGS. 3A-3P are provided as an example. Other examples may differ from what is described with regard to FIGS. 3A-3P. The number and arrangement of devices, layers, and/or materials shown in FIGS. 3A-3P are provided as an example. In practice, there may be additional devices, layers, and/or materials, fewer devices, layers, and/or materials, different devices, layers, and/or materials, or differently arranged devices, layers, and/or materials than those shown in FIGS. 3A-3P.

Figure 4A:
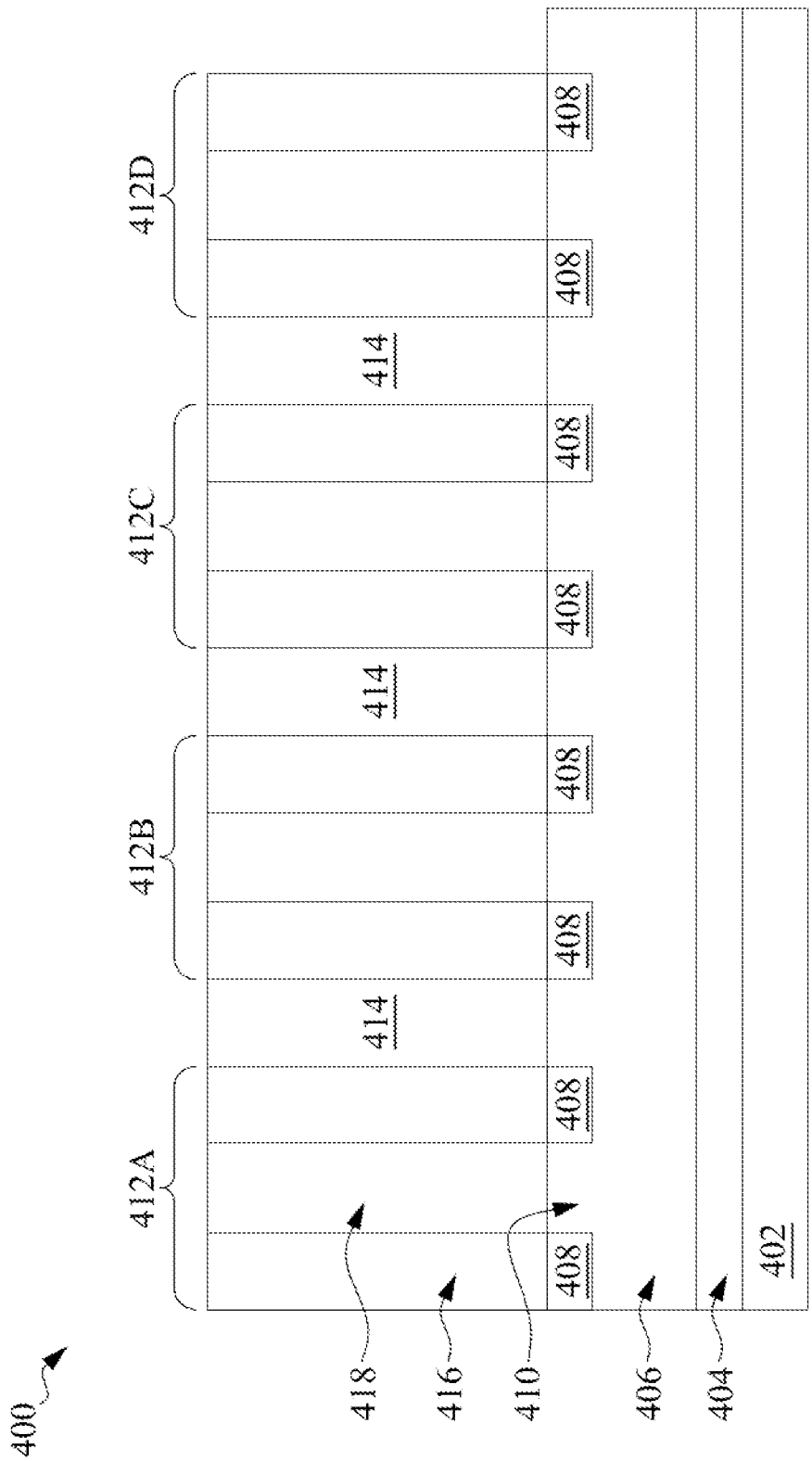
FIGS. 4A-4C are diagrams of an example semiconductor device described herein.
Figure 4B:
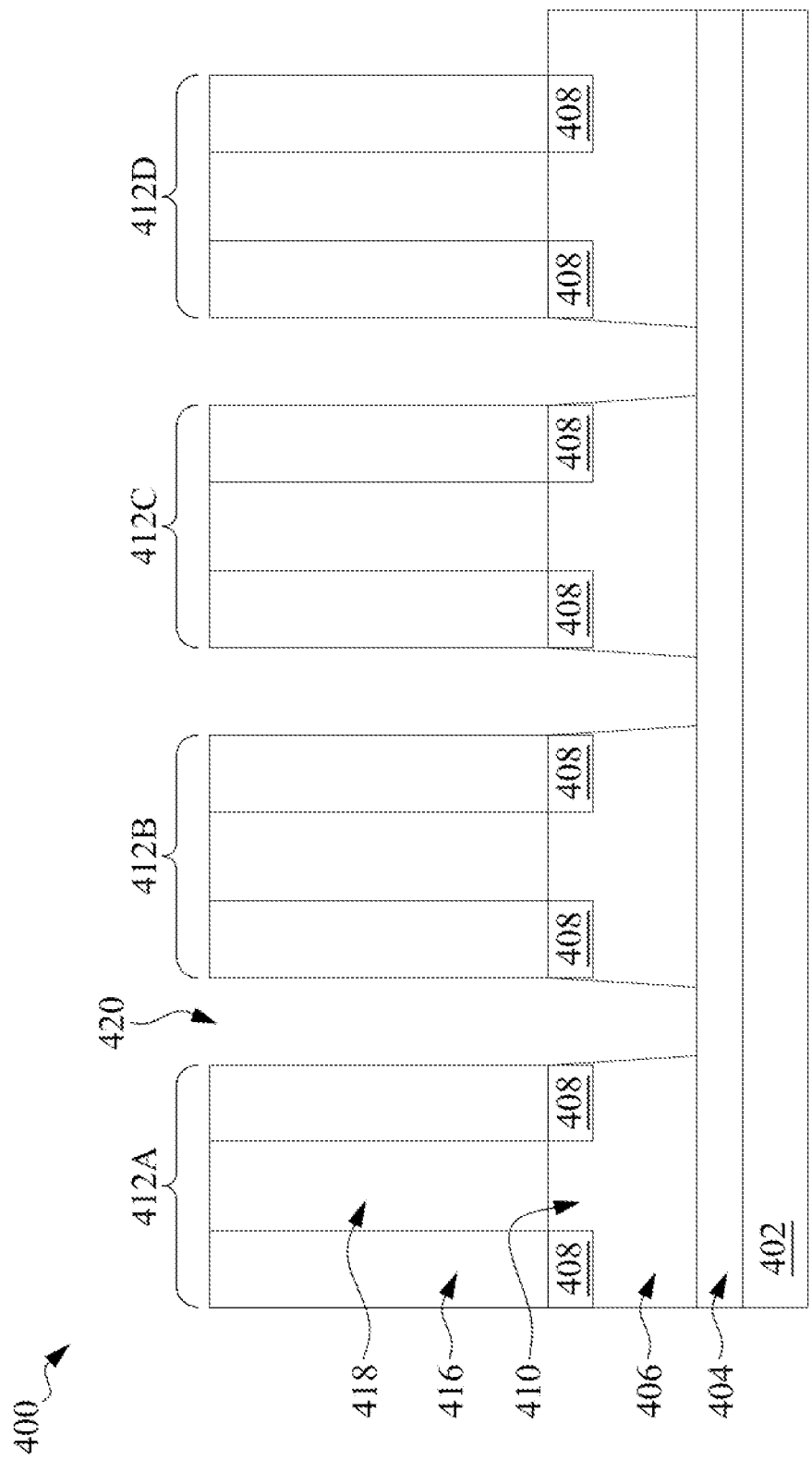
Figure 4C:
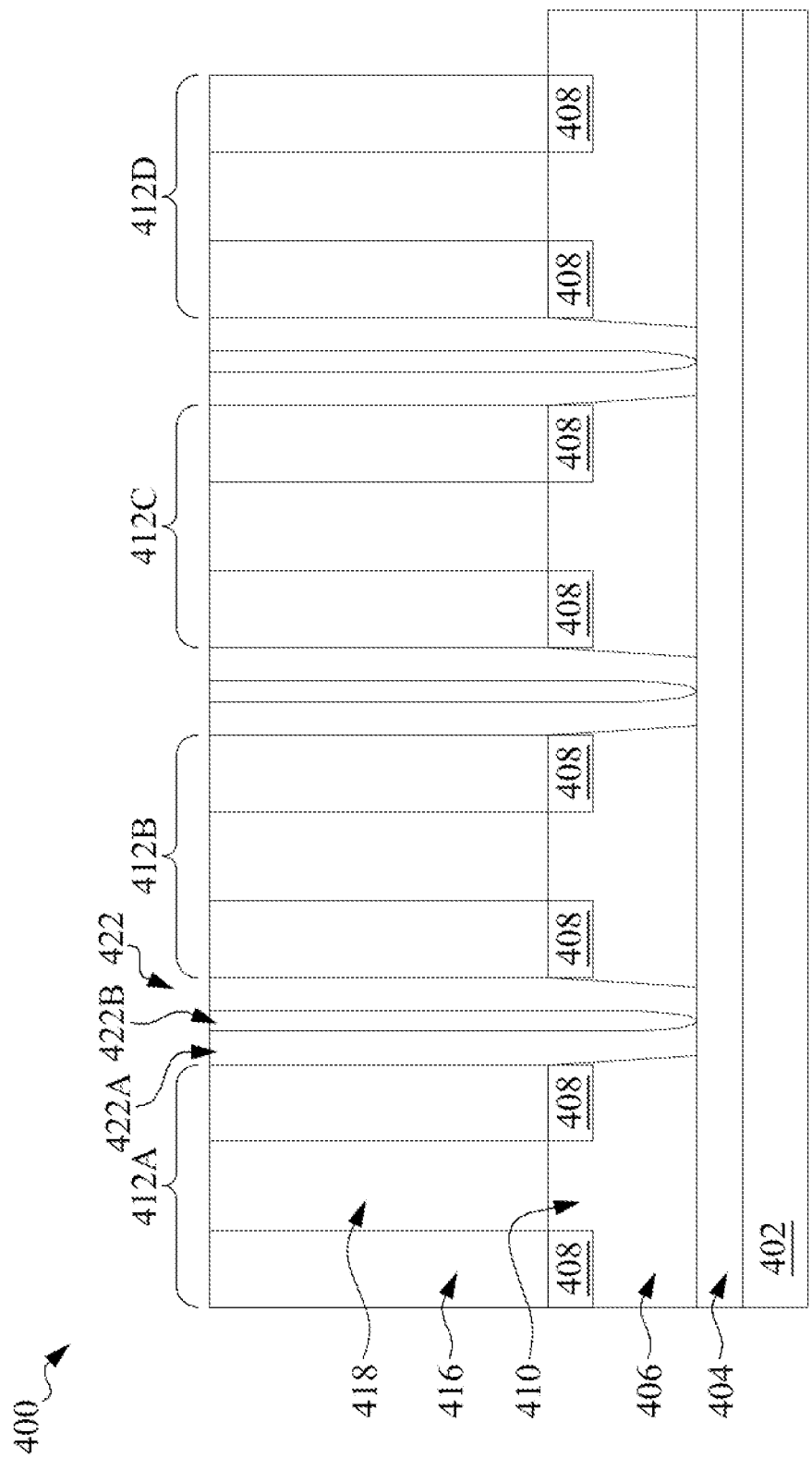

FIGS. 4A-4C are diagrams of an example semiconductor device 400 described herein. Semiconductor device 400 may be manufactured using an example process as shown in FIGS. 4A-4C. The example process may include one or more operations not shown (e.g., lithography operations, operations performed on different portions of an electronic device that includes the semiconductor device 400) and/or operations shown in the example process may be performed in a different order from the order shown in FIGS. 4A-4C. The semiconductor device 400 may include one or more additional devices, structures, and/or layers not shown in FIGS. 4A-4C. For example, the semiconductor device 400 may include additional layers and/or dies formed on layers above and/or below the portion of the semiconductor device 400 shown in FIGS. 4A-4C. Additionally, or alternatively, one or more additional semiconductor structures and/or semiconductor devices may be formed in a same layer, with a lateral displacement, of a device that includes the semiconductor device 400 shown in FIGS. 4A-4C.

As shown in FIG. 4A, the semiconductor device 400 includes a substrate 402 having a well 404 disposed on the substrate 402 and/or one or more additional layers of materials disposed on the well 404. The substrate 402 and the well 404 may have one or more characteristics and/or may be formed using similar procedures as the substrate 202, the well 210, and the well 212 described in connection with FIG. 2A.

The semiconductor device 400 may include a semiconductor structure 406 disposed on the well 404, with the semiconductor structure 406 including fins 410. The semiconductor structure 406 also includes source/drains 408 on opposite sides of the fins 410. The semiconductor device 400 includes a set of gate structures disposed on the fins 410 and the source/drains 408. The set of gate structures includes a first gate structure 412A, a second gate structure 412B, a third gate structure 412C, and/or a fourth gate structure 412D, with a dielectric structure 414 disposed between the gate structures 412A-412D. The gate structures include one or more dielectric structures 416 disposed on opposite sides of a dummy gate structure 418. For example, the one or more dielectric structures may include an inter-layer dielectric and/or a spacer deposited around the dummy gate structure 418. In some implementations, the dummy gate structure 418 may be configured to be removed and replaced with a gate material at a later step of the manufacturing process.

As shown in FIG. 4B the one or more semiconductor processing tools (e.g., the etching tool 104) may remove a portion of the dielectric structure 414 and/or a portion of the semiconductor structure 406 to form a recessed portion 420 that extends from a top surface of the semiconductor device 400 to the well 404. For example, the one or more semiconductor processing tools may use dry etching and/or wet etching to remove the portion of the dielectric structure 414 and/or the portion of the semiconductor structure 406 to form a recessed portion 420.

As shown in FIG. 4C, the one or more semiconductor processing tools (e.g., the deposition tool 102) may deposit isolation material within the recessed portion 420. In some implementations, the one or more semiconductor processing tools may deposit the isolation material, to form an isolation structure 422, using chemical vapor deposition and/or physical vapor deposition, among other examples.

The one or more semiconductor processing tools may deposit the isolation structure 422 in multiple steps. For example, the one or more semiconductor processing tool may deposit a liner material to improve adhesion and/or to reduce peeling. Additionally, the one or more semiconductor processing tools may form an outer portion 422A of the isolation structure 422 in a first operation and may form an inner portion 422B within the outer portion 422A. For example, an etching tool may remove an inner portion of material used to form the outer portion 422A, and a deposition tool may deposit the material used to form the inner portion 422B in place of the removed inner portion of the material used to form the outer portion 422A. The outer portion 422A may be formed of a different material than the inner portion 422B.

The isolation structure 422 may be formed of a material that includes silicon and nitrogen (e.g., silicon nitride), silicon and carbon (silicon carbide), aluminum and nitrogen (aluminum nitride), aluminum and oxygen (e.g., aluminum oxide), silicon, oxygen, and nitrogen, and/or silicon oxygen, carbon, and nitrogen, among other examples.

The isolation structure 422 may include a liner that forms a sidewall of the isolation structure. The liner may have a thickness in a range of approximately 0.5 nanometers to approximately 3 nanometers and/or may include silicon nitride. The inner portion 422B may have a thickness in a range of approximately 0.5 nanometers to approximately 5 nanometers and/or may include silicon nitride.

The isolation structure 422 may have a width above the source/drains that is in a range of approximately 10 nanometers to approximately 30 nanometers. The isolation structure 422 may have a width below the source/drains 408 that is in a range of approximately 5 nanometers to approximately 30 nanometers. The isolation structure 422 may extend a distance (e.g., in a distance (e.g., in a range of approximately 100 nanometers to approximately 250 nano surface of the source/drains 408.

Although not shown, the isolation structure 422 may be disposed on top of the gate structures 412A-412D. In some implementations, a portion of the isolation structure 422 on the top of the gate structures 412A-412D includes a first layer disposed on the top of the gate structures 412A-412D and a second layer disposed on the first layer. The second layer may be disposed using plasma enhanced chemical vapor deposition. The first layer and the second layer are both dielectric materials configured to provide isolation and/or insulation to the gate structures 412A-412D. The isolation structure 422 may include a cut-polysilicon structure. The isolation structure 422 may be deposited around a portion of a fin structure or may be deposited between fin structures (e.g., in place of a removed portion of a fin structure). The isolation structure 422 may be disposed along a y-axis of the semiconductor device (e.g., a vertical direction as shown in FIGS. 2P and 3M).

Based on the semiconductor device 400 including the isolation structure 422 between the gate structures 412A-412D, the semiconductor device 400 may have an increased device density and/or may have reduced current leakage and/or charge carrier tunneling that may have otherwise been caused by a narrow source/drain pitch.

As indicated above, FIGS. 4A-4C are provided as an example. Other examples may differ from what is described with regard to FIGS. 4A-4C. The number and arrangement of devices, layers, and/or materials shown in FIGS. 4A-4C are provided as an example. In practice, there may be additional devices, layers, and/or materials, fewer devices, layers, and/or materials, different devices, layers, and/or materials, or differently arranged devices, layers, and/or materials than those shown in FIGS. 4A-4C.

Figure 5:
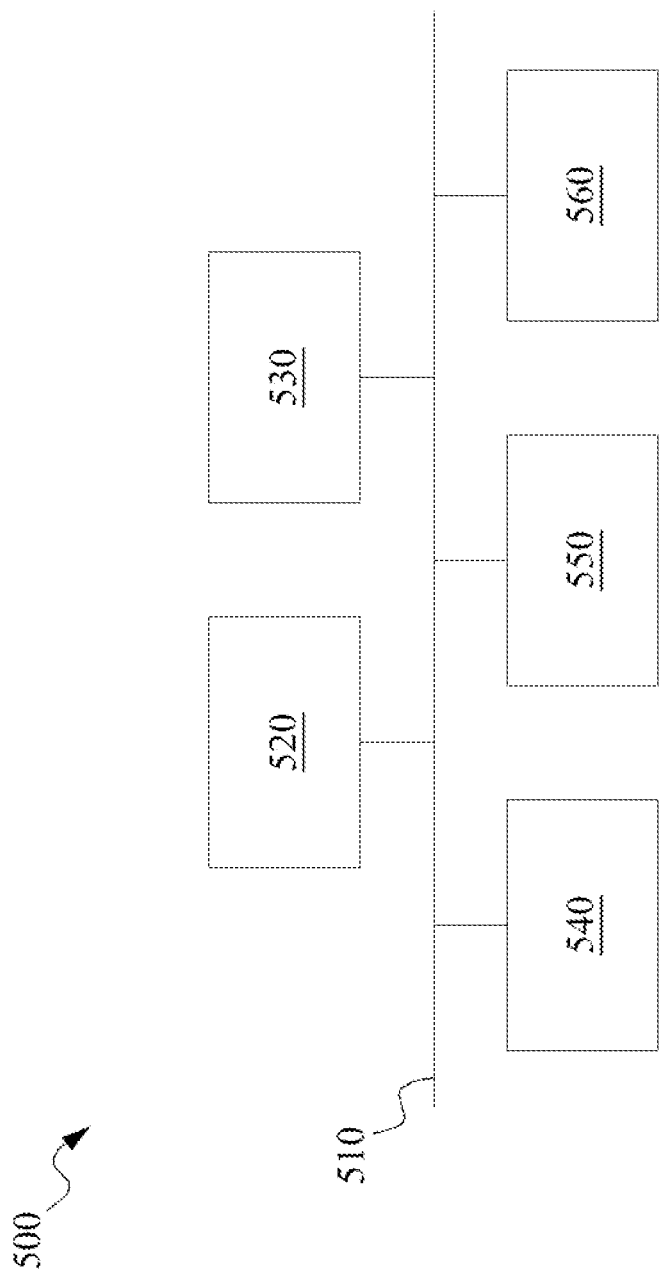
FIG. 5 is a diagram of example components of one or more devices of FIG. 1 described herein.

FIG. 5 is a diagram of example components of a device 500, which may correspond to deposition tool 102, etching tool 104, planarization tool 106, ion implantation tool 108, and/or wafer/die transport tool 110. In some implementations, deposition tool 102, etching tool 104, planarization tool 106, ion implantation tool 108, and/or wafer/die transport tool 110 may include one or more devices 500 and/or one or more components of device 500. As shown in FIG. 5, device 500 may include a bus 510, a processor 520, a memory 530, an input component 540, an output component 550, and a communication component 560.

Bus 510 includes one or more components that enable wired and/or wireless communication among the components of device 500. Bus 510 may couple together two or more components of FIG. 5, such as via operative coupling, communicative coupling, electronic coupling, and/or electric coupling. Processor 520 includes a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 includes one or more processors capable of being programmed to perform one or more operations or processes described elsewhere herein.

Memory 530 includes volatile and/or nonvolatile memory. For example, memory 530 may include random access memory (RAM), read only memory (ROM), a hard disk drive, and/or another type of memory (e.g., a flash memory, a magnetic memory, and/or an optical memory). Memory 530 may include internal memory (e.g., RAM, ROM, or a hard disk drive) and/or removable memory (e.g., removable via a universal serial bus connection). Memory 530 may be a non-transitory computer-readable medium. Memory 530 stores information, instructions, and/or software (e.g., one or more software applications) related to the operation of device 500. In some implementations, memory 530 includes one or more memories that are coupled to one or more processors (e.g., processor 520), such as via bus 510.

Input component 540 enables device 500 to receive input, such as user input and/or sensed input. For example, input component 540 may include a touch screen, a keyboard, a keypad, a mouse, a button, a microphone, a switch, a sensor, a global positioning system sensor, an accelerometer, a gyroscope, and/or an actuator. Output component 550 enables device 500 to provide output, such as via a display, a speaker, and/or a light-emitting diode. Communication component 560 enables device 500 to communicate with other devices via a wired connection and/or a wireless connection. For example, communication component 560 may include a receiver, a transmitter, a transceiver, a modem, a network interface card, and/or an antenna.

Device 500 may perform one or more operations or processes described herein. For example, a non-transitory computer-readable medium (e.g., memory 530) may store a set of instructions (e.g., one or more instructions or code) for execution by processor 520. Processor 520 may execute the set of instructions to perform one or more operations or processes described herein. In some implementations, execution of the set of instructions, by one or more processors 520, causes the one or more processors 520 and/or the device 500 to perform one or more operations or processes described herein. In some implementations, hardwired circuitry may be used instead of or in combination with the instructions to perform one or more operations or processes described herein. Additionally, or alternatively, processor 520 may be configured to perform one or more operations or processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
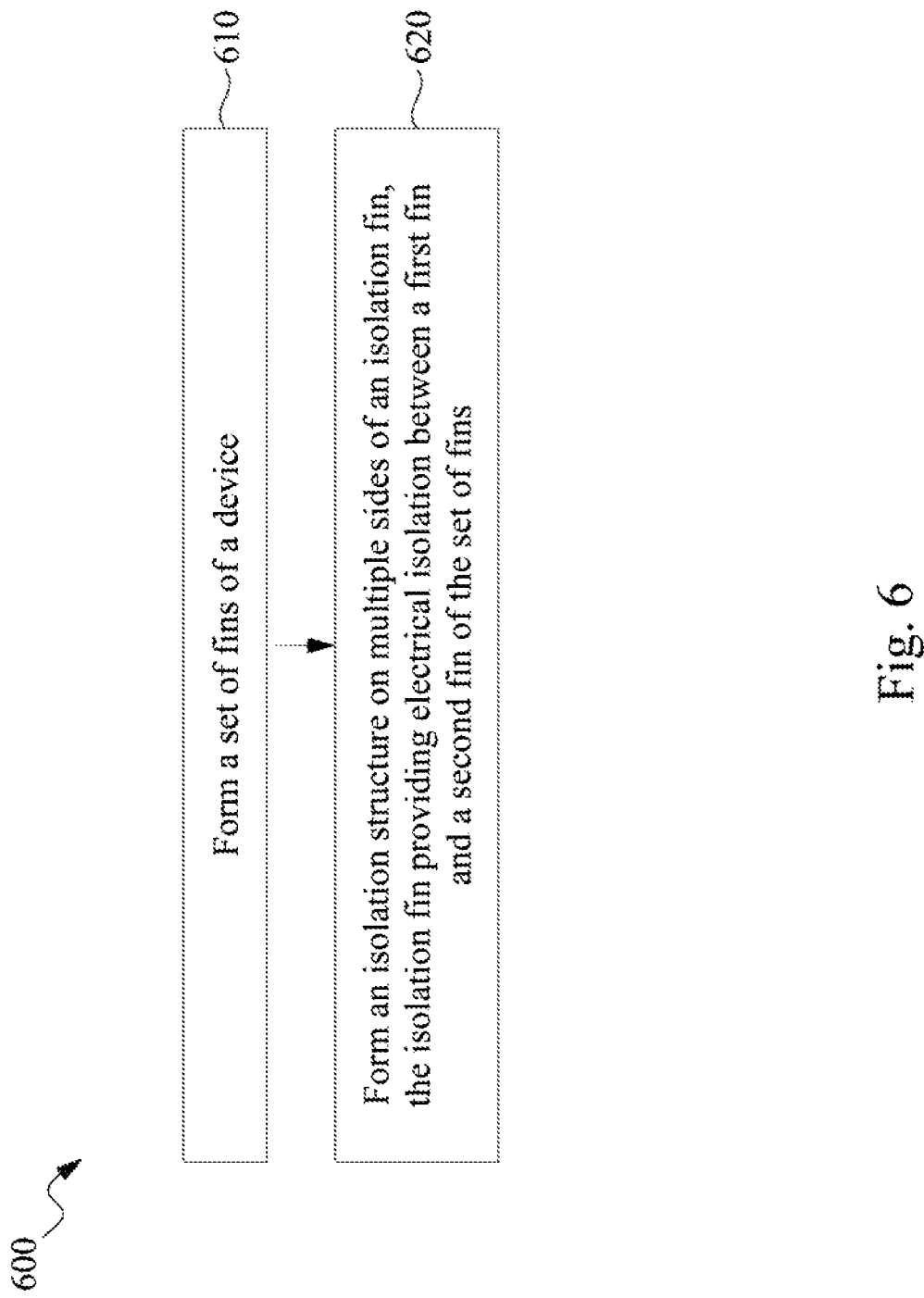
FIGS. 6-8 are flowcharts of example processes relating to forming a semiconductor device described herein.

FIG. 6 is a flowchart of an example process 600 associated with semiconductor device and methods of manufacturing the same. In some implementations, one or more process blocks of FIG. 6 may be performed by a one or more semiconductor processing tools (e.g., deposition tool 102, etching tool 104, planarization tool 106, ion implantation tool 108, and/or wafer/die transport tool 110). Additionally, or alternatively, one or more process blocks of FIG. 6 may be performed by one or more components of device 500, such as processor 520, memory 530, input component 540, output component 550, and/or communication component 560.

As shown in FIG. 6, process 600 may include forming a set of fins of a device (block 610). For example, the one or more semiconductor processing tools may form a set of fins 220, 222, and 224 of a device 200, as described above. In some implementations, the set of fins comprises an isolation fin 224 disposed between a first fin 220 and a second fin 222 of the set of fins.

As further shown in FIG. 6, process 600 may include forming an isolation structure on at least one side of the isolation fin, the isolation fin providing electrical isolation between the first fin and the second fin of the set of fins (block 620). For example, the one or more semiconductor processing tools may form an isolation structure 246 on at least one side of the isolation fin 224, the isolation fin 224 providing electrical isolation between the first fin 220 and the second fin 222 of the set of fins, as described above.

Process 600 may include additional implementations, such as any single implementation or any combination of implementations described below and/or in connection with one or more other processes described elsewhere herein.

In a first implementation, the a first source/drain region is disposed on the first fin 220 and a second source/drain region is disposed on the second fin 222.

In a second implementation, alone or in combination with the first implementation, the first fin 220 and the second fin 222 have a first polarization and the isolation fin 224 has a second polarization that is opposite the first polarization.

In a third implementation, alone or in combination with one or more of the first and second implementations, the forming the isolation structure 246 comprises removing a portion of a dielectric layer 242 and a portion of a trench isolation structure 226 from the at least one side (e.g., from the multiple sides) of the isolation fin 224, and depositing isolation material on the at least one side of the isolation fin 224 after removing the portion the dielectric layer 242 and the portion of the trench isolation structure 226.

In a fourth implementation, alone or in combination with one or more of the first through third implementations, removing the portion of the trench isolation structure 226 from the at least one side (e.g., from multiple sides) of the isolation fin comprises removing the portion of the trench isolation structure 226 that is above a bottom surface of an anti-punch through layer 214 of the isolation fin 224, and wherein depositing the isolation material on the at least one side of the isolation fin 224 comprises depositing the isolation material on at least one side of the anti-punch through layer 214 of the isolation fin 224.

In a fifth implementation, alone or in combination with one or more of the first through fourth implementations, the isolation structure 246 extends from the isolation fin 224 to one or more dummy fins disposed between the isolation fin 224 and the first fin 220 or between the isolation fin 224 and the second fin 222.

In a sixth implementation, alone or in combination with one or more of the first through fifth implementations, the isolation structure 246 extends above a top surface of the isolation fin 224.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

Figure 7:
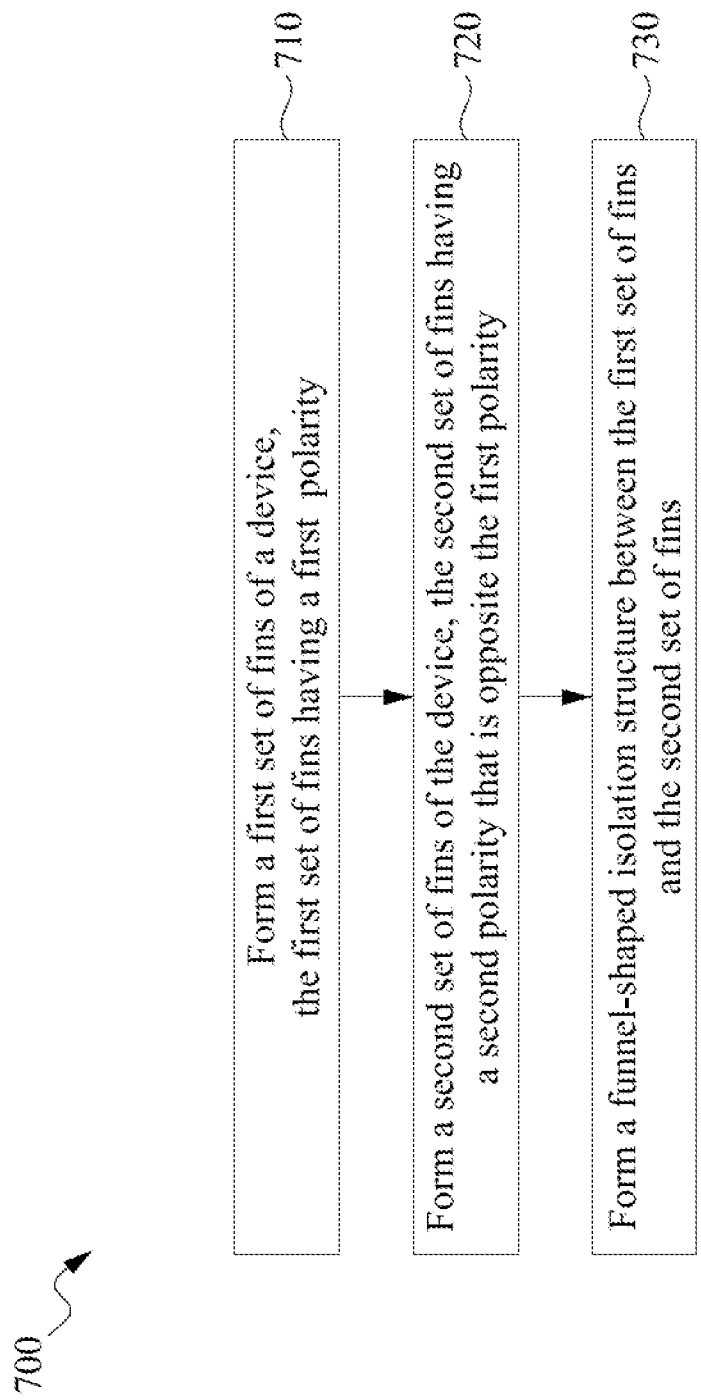

FIG. 7 is a flowchart of an example process 700 associated with semiconductor device and methods of manufacturing the same. In some implementations, one or more process blocks of FIG. 7 may be performed by a one or more semiconductor processing tools (e.g., deposition tool 102, etching tool 104, planarization tool 106, ion implantation tool 108, and/or wafer/die transport tool 110). Additionally, or alternatively, one or more process blocks of FIG. 7 may be performed by one or more components of device 500, such as processor 520, memory 530, input component 540, output component 550, and/or communication component 560.

As shown in FIG. 7, process 700 may include forming a first set of fins of a device, the first set of fins having a first polarity (block 710). For example, the one or more semiconductor processing tools may form a first set of fins 220 of a device 300, the first set of fins 220 having a first polarity, as described above.

As further shown in FIG. 7, process 700 may include forming a second set of fins of the device, the second set of fins having a second polarity that is opposite the first polarity (block 720). For example, the one or more semiconductor processing tools may form a second set of fins 222 of the semiconductor device 300, the second set of fins 222 having a second polarity that is opposite the first polarity, as described above.

As further shown in FIG. 7, process 700 may include forming a funnel-shaped isolation structure between the first set of fins and the second set of fins (block 730). For example, the one or more semiconductor processing tools may form a funnel-shaped isolation structure 306 between the first set of fins 220 and the second set of fins 222, as described above.

Process 700 may include additional implementations, such as any single implementation or any combination of implementations described below and/or in connection with one or more other processes described elsewhere herein.

In a first implementation, the first set of fins 220 are formed on a first well 210 having the first polarity, wherein the second set of fins 222 are formed on a second well 302 having the second polarity, and wherein the funnel-shaped isolation structure 306 extends into an interface between the first well 210 and the second well 302 (e.g., the well 212 and/or a transition between the well 212 and one of the first well 210 and the second well 302).

In a second implementation, alone or in combination with the first implementation, the funnel-shaped isolation structure 306 comprises a material that includes one or more of silicon and nitrogen, silicon and carbon, aluminum and nitrogen, aluminum and oxygen, silicon, oxygen, and nitrogen, or oxygen, carbon, and nitrogen.

In a third implementation, alone or in combination with one or more of the first and second implementations, the forming the funnel-shaped isolation structure 306 comprises forming a recessed portion 304 of the semiconductor device 300 by removing a portion of a dielectric layer 242, a portion of a trench isolation structure 226, a portion of a well 212 associated with an isolation fin 224

In a fourth implementation, alone or in combination with one or more of the first through third implementations, the funnel-shaped isolation structure 306 has a first width within the dielectric layer 242, wherein the funnel-shaped isolation structure 306 has a second width within the trench isolation structure 306, the second width being less than the first width, and wherein the funnel-shaped isolation structure 306 has a third width between the first well 302 and the second well 210, the third width being less than the second width.

In a fifth implementation, alone or in combination with one or more of the first through fourth implementations, the first set of fins 220 comprises a first set of source/drains having the first polarity, and wherein the second set of fins 222 comprises a second set of source/drains having the second polarity.

In a sixth implementation, alone or in combination with one or more of the first through fifth implementations, the funnel-shaped isolation structure 306 extends to a first height, relative to a substrate 302 of the semiconductor device 300, that is greater than or equal to a second height, relative to the substrate 302 of the semiconductor device 300, of the first set of fins 220.

In a seventh implementation, alone or in combination with one or more of the first through sixth implementations, the funnel-shaped isolation structure 306 extends between dummy fins 250 formed between the first set of fins 220 and the second set of fins 222.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8:
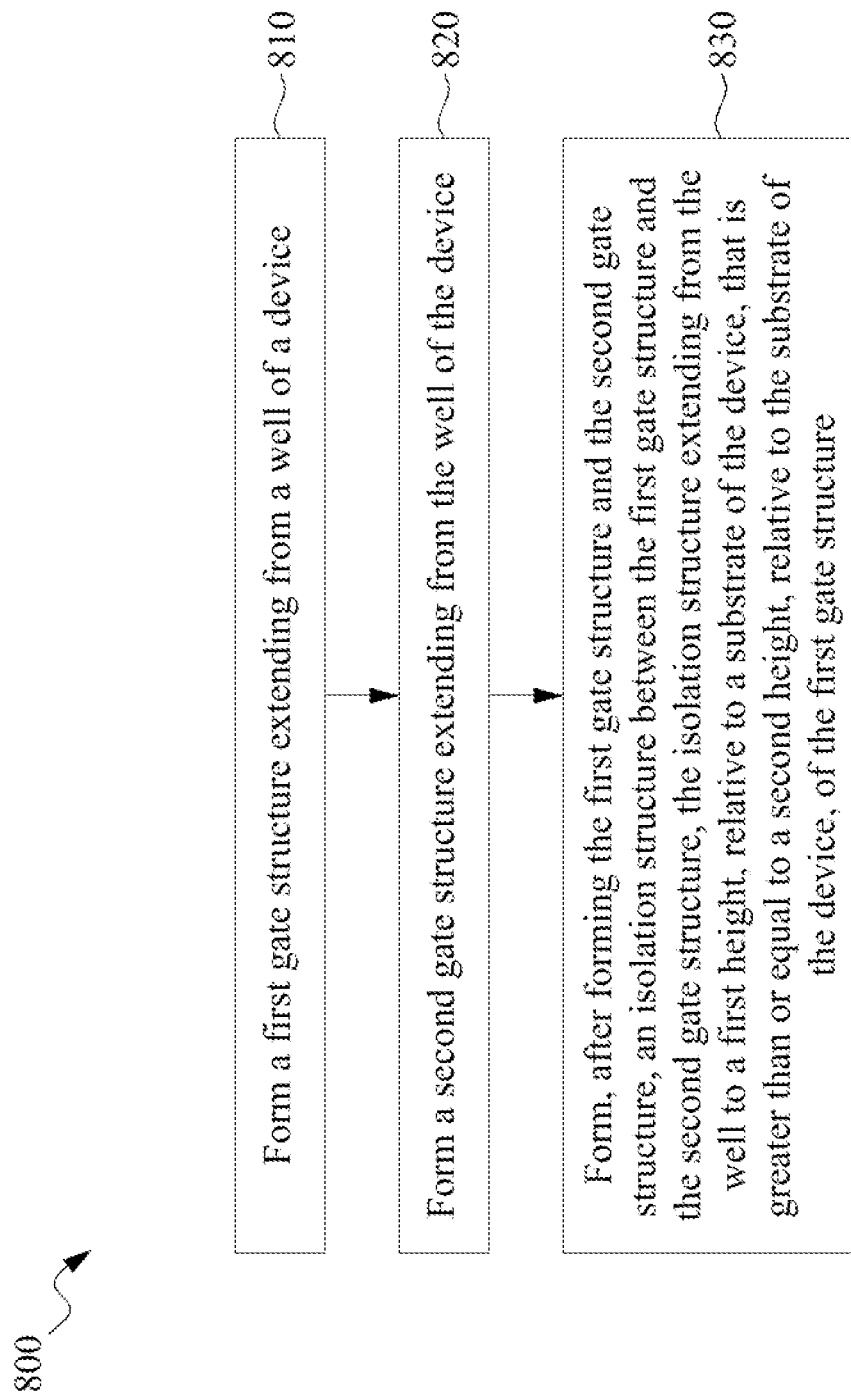

FIG. 8 is a flowchart of an example process 800 associated with semiconductor device and methods of manufacturing the same. In some implementations, one or more process blocks of FIG. 8 may be performed by a one or more semiconductor processing tools (e.g., deposition tool 102, etching tool 104, planarization tool 106, ion implantation tool 108, and/or wafer/die transport tool 110). Additionally, or alternatively, one or more process blocks of FIG. 8 may be performed by one or more components of device 500, such as processor 520, memory 530, input component 540, output component 550, and/or communication component 560.

As shown in FIG. 8, process 800 may include forming a first gate structure extending from a well of a device (block 810). For example, the one or more semiconductor processing tools may form a first gate structure 412A extending from a well 404 of a device 400, as described above.

As further shown in FIG. 8, process 800 may include forming a second gate structure extending from the well 404 of the device (block 820). For example, the one or more semiconductor processing tools may form a second gate structure 412B extending from the well 404 of the semiconductor device 400, as described above.

As further shown in FIG. 8, process 800 may include forming, after forming the first gate structure and the second gate structure, an isolation structure between the first gate structure and the second gate structure, the isolation structure extending from the well to a first height, relative to a substrate of the device, that is greater than or equal to a second height, relative to the substrate of the device, of the first gate structure (block 830). For example, the one or more semiconductor processing tools may form, after forming the first gate structure 412A and the second gate structure 412B, an isolation structure 422 between the first gate structure 412A and the second gate structure 412B, the isolation structure 422 extending from the well 404 to a first height, relative to a substrate 402 of the semiconductor device 400, that is greater than or equal to a second height, relative to the substrate 402 of the semiconductor device 400, of the first gate structure 412A, as described above.

Process 800 may include additional implementations, such as any single implementation or any combination of implementations described below and/or in connection with one or more other processes described elsewhere herein.

In a first implementation, forming the first gate structure 412A comprises forming a fin 410 between source/drains 408 of the first gate structure 412A, and forming a dummy gate structure 418 on the fin 410.

In a second implementation, alone or in combination with the first implementation, the first gate structure 412A and the second gate structure 412B comprise nanostructure-based gate structures.

In a third implementation, alone or in combination with one or more of the first and second implementations, a first portion of the isolation structure 422, formed at above a height of a source/drain 408 of the first gate structure 412A, has a first width, wherein a second portion of the isolation structure 422, formed below the height of the source/drain 408 of the first gate structure 412A, has a second width, and wherein the second width is less than or equal to the first width.

In a fourth implementation, alone or in combination with one or more of the first through third implementations, forming the isolation structure 422 further comprises forming an outer portion 422A of the isolation structure 422 comprising a first isolation material, and forming an inner portion 422B of the isolation structure 422 comprising a second isolation material.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

As described herein, an isolation structure may be a funnel-shaped isolation structure having a greatest width at an upper portion of the funnel-shaped isolation structure and a smallest width at a lower portion of the funnel-shaped isolation structure. In this way, the funnel-shaped isolation structure may provide a greatest electrical barrier at the upper portion of the funnel-shaped isolation structure, which may be disposed between portions of neighboring fins having n-doped or p-doped epitaxial material.

In some cases, the isolation structure may be formed on an isolation fin disposed between a first fin and a second fin. In this way, the isolation structure may have improved structural support based on bonding with the fin.

In some cases, the isolation structure may be formed between a first gate structure and a second gate structure, with the isolation structure extending to at least a height of the first gate structure and the second gate structure from a well below the first gate structure and the second gate structure. In this way, the isolation structure may provide isolation between gate structures without forming the isolation structure in place of a polysilicon structure that may be used for another gate and/or to improve a device density of the device.

In some implementations, the isolation structure may be a multi-layered isolation structure having layers with different N concentrations. In some implementations, the multi-layered isolation structure may be a fully stressed and dense semiconductor structure. Additionally, or alternatively, the isolation structure may be formed different levels of mechanical strength based on an atomic layer deposition process used to deposit layers of the isolation structure.

As described in greater detail above, some implementations described herein provide a method. The method includes forming a set of fins of a device, where the set of fins comprises an isolation fin disposed between a first fin and a second fin of the set of fins. The method also includes forming an isolation structure on at least one side of the isolation fin, with the isolation fin providing electrical isolation between the first fin and the second fin of the set of fins.

As described in greater detail above, some implementations described herein provide a method. The method includes forming a first set of fins of a device, the first set of fins having a first polarity. The method also includes forming a second set of fins of the device, with the second set of fins having a second polarity that is opposite the first polarity. The method further includes forming a funnel-shaped isolation structure between the first set of fins and the second set of fins.

As described in greater detail above, some implementations described herein provide a method. The method includes forming a first gate structure extending from a well of a device. The method includes forming a second gate structure extending from the well of the device. The method includes forming, after forming the first gate structure and the second gate structure, an isolation structure between the first gate structure and the second gate structure, the isolation structure extending from the well to a first height, relative to a substrate of the device, that is greater than or equal to a second height, relative to the substrate of the device, of the first gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a set of fins of a device,
      wherein the set of fins comprises an isolation fin disposed between a first fin and a second fin of the set of fins; and
   forming an isolation structure on a top surface and at least one side of the isolation fin, the isolation fin providing electrical isolation between the first fin and the second fin of the set of fins.

2. The method of claim 1, wherein a first source/drain region is disposed on the first fin and a second source/drain region is disposed on the second fin.

3. The method of claim 1, wherein the first fin and the second fin have a first polarization and the isolation fin has a second polarization that is opposite the first polarization.

4. The method of claim 1, wherein the forming the isolation structure comprises:
   removing a portion of a dielectric layer and a portion of a trench isolation structure from the at least one side of the isolation fin; and
   depositing isolation material on the at least one side of the isolation fin after removing the portion of the dielectric layer and the portion of the trench isolation structure.

5. The method of claim 4, wherein removing the portion of the trench isolation structure from the at least one side of the isolation fin comprises removing the portion of the trench isolation structure that is above a bottom surface of an anti-punch through layer of the isolation fin, and
   wherein depositing the isolation material on the at least one side of the isolation fin comprises depositing the isolation material on at least one side of the anti-punch through layer of the isolation fin.

6. The method of claim 1, wherein the isolation structure extends from the isolation fin to one or more dummy fins disposed between the isolation fin and the first fin or between the isolation fin and the second fin.

7. The method of claim 1, wherein the isolation structure extends above a top surface of the isolation fin.

8. A method comprising:
   forming a first set of fins of a device on a first well, the first set of fins having a first polarity;
   forming a second set of fins of the device on a second well, the second set of fins having a second polarity that is opposite the first polarity; and
   forming a funnel-shaped isolation structure, between the first set of fins and the second set of fins, at least partially into a third well.

9. The method of claim 8, wherein the funnel-shaped isolation structure extends into an interface between the first well and the second well.

10. The method of claim 8, wherein the funnel-shaped isolation structure comprises a material that includes one or more of:
    silicon and nitrogen,
    silicon and carbon,
    aluminum and nitrogen,
    aluminum and oxygen,
    silicon, oxygen, and nitrogen, or
    silicon oxygen, carbon, and nitrogen.

11. The method of claim 8, wherein the forming the funnel-shaped isolation structure comprises:
    forming a recessed portion of the device by removing a portion of a dielectric layer, a portion of a trench isolation structure, and a portion of the third well; and
    depositing isolation material within the recessed portion.

12. The method of claim 11, wherein the funnel-shaped isolation structure has a first width within the dielectric layer,
    wherein the funnel-shaped isolation structure has a second width within the trench isolation structure, the second width being less than the first width, and
    wherein the funnel-shaped isolation structure has a third width between the first well and the second well, the third width being less than the second width.

13. The method of claim 8, wherein the first set of fins comprises a first set of source/drains having the first polarity, and
    wherein the second set of fins comprises a second set of source/drains having the second polarity.

14. The method of claim 8, wherein the funnel-shaped isolation structure extends to a first height, relative to a substrate of the device, that is greater than or equal to a second height, relative to the substrate of the device, of the first set of fins.

15. The method of claim 8, wherein the funnel-shaped isolation structure extends between dummy fins formed between the first set of fins and the second set of fins.

16. A method comprising:
    forming a first gate structure extending from, and intersecting with, a surface of a well of a device;

forming a second gate structure extending from, and intersecting with, the surface of the well of the device; and forming, after forming the first gate structure and the second gate structure, an isolation structure between the first gate structure and the second gate structure, the isolation structure extending from the surface of the well to a first height, relative to a substrate of the device, that is greater than or equal to a second height, relative to the substrate of the device, of the first gate structure.

17. The method of claim 16, wherein forming the first gate structure comprises:

forming a fin between source/drains of the first gate structure; and forming a dummy gate structure on the fin.

18. The method of claim 16, wherein the first gate structure and the second gate structure comprise nanostructure-based gate structures.

19. The method of claim 16, wherein a first portion of the isolation structure, formed at above a height of a source/drain of the first gate structure, has a first width, wherein a second portion of the isolation structure, formed below the height of the source/drain of the first gate structure, has a second width, and wherein the second width is less than or equal to the first width.

20. The method of claim 16, wherein forming the isolation structure further comprises:

forming an outer portion of the isolation structure comprising a first isolation material; and forming an inner portion of the isolation structure comprising a second isolation material.

* * * * *